United States Patent
Mori et al.

(10) Patent No.: US 8,710,669 B2
(45) Date of Patent: Apr. 29, 2014

(54) SEMICONDUCTOR DEVICE MANUFACTURE IN WHICH MINIMUM WIRING PITCH OF CONNECTING PORTION WIRING LAYER IS LESS THAN MINIMUM WIRING PITCH OF ANY OTHER WIRING LAYER

(75) Inventors: Kentaro Mori, Tokyo (JP); Yoshiki Nakashima, Tokyo (JP); Daisuke Ohshima, Tokyo (JP); Katsumi Kikuchi, Tokyo (JP); Shintaro Yamamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/320,798

(22) PCT Filed: May 18, 2010

(86) PCT No.: PCT/JP2010/058331
§ 371 (c)(1),
(2), (4) Date: Nov. 16, 2011

(87) PCT Pub. No.: WO2010/134511
PCT Pub. Date: Nov. 25, 2010

(65) Prior Publication Data
US 2012/0068359 A1    Mar. 22, 2012

(30) Foreign Application Priority Data
May 20, 2009 (JP) ................. 2009-122209

(51) Int. Cl.
*H01L 23/498* (2006.01)
*H01L 21/56* (2006.01)

(52) U.S. Cl.
USPC .......... 257/774; 257/E23.067; 257/E21.502; 257/773; 257/668; 257/784

(58) Field of Classification Search
USPC ......... 257/774, 773, E23.067, E21.502, 668, 257/784
See application file for complete search history.

(56) References Cited

U.S. PATENT DOCUMENTS 7,696,007 B2 *   4/2010   Kikuchi et al. ............... 438/107
7,727,802 B2 *   6/2010   Sunohara et al. ............. 438/107
(Continued)

FOREIGN PATENT DOCUMENTS

JP      2002-50874 A     2/2002
JP      2003229670 A     8/2003
(Continued)

OTHER PUBLICATIONS

International Search Report for PCT/JP2010/058331 mailed Jun. 15, 2010.
(Continued)

*Primary Examiner* — Alexander Oscar Williams
(74) *Attorney, Agent, or Firm* — Sughrue Mion, PLLC

(57) ABSTRACT

A semiconductor device includes a core substrate, and at least one insulating layer and at least one wiring layer that are disposed on a first surface and a second, opposite surface of the substrate. The semiconductor device includes a via disposed in the insulating layer and in the core substrate, and which connects the wiring layers to one another. The semiconductor device includes a semiconductor element mounted on the first surface, forming an electrode terminal that faces up. The semiconductor device includes a connecting portion that penetrates the insulating layer and directly connects the electrode terminal of the semiconductor element and the wiring layer on the first surface. A minimum wiring pitch of this wiring that of any wiring layer on the second surface.

18 Claims, 20 Drawing Sheets

(56) References Cited

U.S. PATENT DOCUMENTS

| | | | |
|---|---|---|---|
| 7,781,681 B2* | 8/2010 | Kariya | 174/260 |
| 2011/0155433 A1* | 6/2011 | Funaya et al. | 174/258 |
| 2011/0256662 A1* | 10/2011 | Yamano et al. | 438/107 |
| 2012/0261735 A1* | 10/2012 | Iizuka et al. | 257/296 |
| 2012/0319254 A1* | 12/2012 | Kikuchi et al. | 257/659 |

FOREIGN PATENT DOCUMENTS

| | | | |
|---|---|---|---|
| JP | 2004179288 A | 6/2004 | |
| JP | 2005108937 A | 4/2005 | |
| JP | 2005136282 A | 5/2005 | |
| JP | 2005311240 A | 11/2005 | |
| JP | 2005340159 A | 12/2005 | |
| JP | 2007-103939 A | 4/2007 | |
| JP | 2009076565 A | 4/2009 | |

OTHER PUBLICATIONS

Japanese Office Action for JP Application No. 2011-514414 mailed on Dec. 3, 2013 with Partial English Translation.

* cited by examiner

SEMICONDUCTOR DEVICE MANUFACTURE IN WHICH MINIMUM WIRING PITCH OF CONNECTING PORTION WIRING LAYER IS LESS THAN MINIMUM WIRING PITCH OF ANY OTHER WIRING LAYER

REFERENCE TO RELATED APPLICATION

This application is based upon and claims the benefit of the priority of Japanese patent application No. 2009-122209, filed on May 20, 2009, the disclosure of which is incorporated herein in its entirety by reference thereto.

TECHNICAL FIELD

The present invention relates to a semiconductor device and a method for manufacturing the semiconductor device. Particularly, the present invention relates to a semiconductor device having a semiconductor element embedded in a wiring substrate and a method for manufacturing the semiconductor device.

BACKGROUND

In recent years, in order to realize smaller and thinner electronic devices with high functionality and performance, high-density packaging techniques for semiconductor packages are demanded. As one of means for solving the problem, a substrate with built-in semiconductor element embedding a semiconductor element in the wiring substrate was proposed, and the research and development are underway. Meanwhile, as a circuit scale of a semiconductor element embedded in a wiring substrate is increased, the number of external connection terminals is increased, and the pitch between the external connection terminals is getting narrower. Patent Documents 1-3 describe conventional substrates with built-in semiconductor element embedding a semiconductor element.

FIG. 19 is a sectional view of a substrate with built-in semiconductor element described in Patent Document 1. There is provided a substrate with built-in semiconductor element (electronic device 1) of FIG. 19, in which wiring layers 10a-10c and electric insulating layers 9a-9d are stacked on a core substrate 2, and the wiring layers 10a-10c are made conductive to each other as desired by upper-and-lower conductive vias 7a-7d disposed in the electric insulating layers 9a-9d. In the electronic device 1, built-in electronic component layers 5A, 5B embedding electronic component(s) 8 are provided between the wiring layers 10a-10c or the core substrate 2 and the electric insulating layers 9a-9d. Terminal portions 8a of electronic components 8 are connected to wiring layers 10a, 10c through upper-and-lower penetrating vias 7. Meanwhile, Patent Document 1 describes only an embodiment in which a wiring layer and an electric insulating layer are disposed mainly on one side of the core substrate 2. However, Patent Document 1 describes that wiring layers, electric insulating layers and built-in electronic component layers may be formed on the two sides of the core substrate 2.

FIG. 20 is a sectional view of a semiconductor device mounting a semiconductor element (chip) 30 on one side of a core substrate 121, and having resin layers (insulating layers) 26a, 26b and wiring layers 27a, 27b on the two sides of the core substrate 121, which is described in Patent Document 2. Patent Document 2 describes that wirings can be drawn without increasing the number of wiring layers by providing a wiring layer 33 connected to an electrode pad 31 of the chip 30 on the chip 30 in advance using wafer-level packaging technique, and connecting the wiring layer 33 and the upper wiring layer 27 by via(s) VH1. Patent Document 2 describes a method for manufacturing the above-mentioned semiconductor device in which resin layers 26a, 26b are formed on two sides of the core substrate 121; after forming the resin layers on the two sides, via holes VH1, VH2 are formed on the two sides; shield layers are formed on the whole surfaces of the resin layers 26a, 26b including inner portions of the via holes VH1, VH2 respectively by means of electroless copper plating; after forming resist patterns on them, the via holes VH1, VH2 are filled up with a conductive material through electric field plating, and the wiring layer 27a of the top side and the wiring layer 27b of the bottom side are formed simultaneously.

Patent Document 1

Japanese Patent Kokai Publication No. JP-P2005-108937A

Patent Document 2

Japanese Patent Kokai Publication No. JP-P2005-311240A

Patent Document 3

Japanese Patent Kokai Publication No. JP-P2004-179288A

SUMMARY

The entire disclosures of Patent Documents 1-3 above are incorporated herein by reference thereto. The following analyses are given according to the present invention. As described in an embodiment of Patent Document 1, if a semiconductor element is embedded in one side of the core substrate, and an insulating layer and a wiring layer are stacked only on the one side of the core substrate, a warp is caused as described below. Namely, if the core substrate is arranged at the bottom, the warp is concave as a whole semiconductor device, while the warp is convex around the semiconductor element. Therefore, a problem is caused when other components are mounted on the semiconductor substrate, or the semiconductor device is mounted on a mother board.

The pitch between electrode terminals of a built-in semiconductor element is getting narrower. Thus, at least wiring pitches and shapes of a connecting portion and a wiring layer which are directly connected to the semiconductor element must be small. However, if shapes of the whole vias and wirings are designed to be finer, a cost increase and a yield rate degradation of the semiconductor device are brought about.

It is an object of the present invention to provide a semiconductor device which achieves less warp as a whole and can be manufactured at a high yield, and a method for manufacturing the same, in a semiconductor device having a substrate with built-in semiconductor element.

A semiconductor device according to a first aspect of the present invention comprises: a core substrate; at least one insulating layer and at least one wiring layer which are disposed on each of a first surface of the core substrate and a second surface opposite to the first surface; a via(s) which is disposed in each of the insulating layer and the core substrate, and connects the wiring layers to each other; a semiconductor element mounted on the first surface of the core substrate, with a surface for forming an electrode terminal(s) facing up; and a connecting portion(s) which penetrates the insulating layer disposed on the first surface and directly connects the electrode terminal of the semiconductor element and the wiring layer disposed on the first surface, wherein a minimum wiring pitch of the wiring layer directly connected to the connecting portion is smaller than a minimum wiring pitch of any of the wiring layer(s) disposed on the second surface.

A method for manufacturing a semiconductor device according to a second aspect of the present invention comprises: mounting a semiconductor element, with a surface for forming an electrode terminal(s) facing up on a first surface of a core substrate, in which core wirings are disposed on a surface of the first surface and a surface of a second surface opposite to the first surface, and a penetrating via(s) connecting the core wirings of the first surface and the second surface is further disposed; forming a first insulating layer, covering the semiconductor element, on the first surface; a first wiring forming that forms a first wiring layer on a surface of the first insulating layer, and forms a wiring connected to an electrode terminal(s) of the semiconductor element through a connecting portion(s) and a wiring(s) connected to the core wiring disposed on the first surface through a via(s) on the first wiring layer; forming a second insulating layer on the second surface; and a second wiring forming that forms a second wiring layer on a surface of the second insulating layer, and forms a wiring(s) connected to the core wiring disposed on the second surface through a via(s) on the second wiring layer, wherein a set of forming the first insulating layer and the first wiring forming is carried out in a different step from a set of forming the second insulating layer and the second wiring forming.

According to the present invention, there can be provided a semiconductor device having a semiconductor element embedded in a substrate, the device having a configuration that achieves less warp as a whole and the device can be manufactured at high yield. According to the method for manufacturing a semiconductor device of the present invention, a semiconductor device can be manufactured at a low cost and a high yield.

PREFERRED MODES

Figure 1:
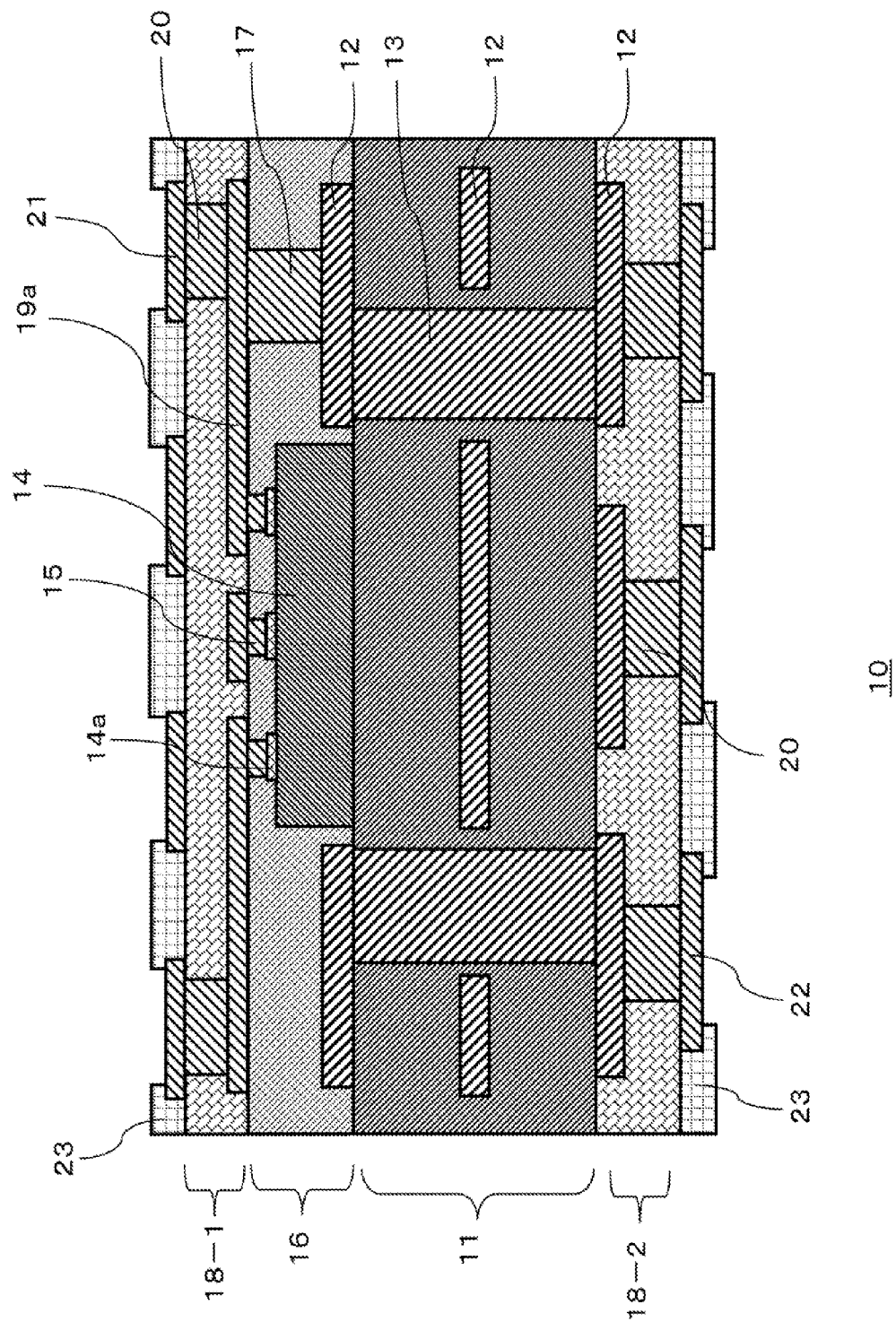
FIG. 1 is a sectional view of a semiconductor device in accordance with an exemplary embodiment 1 of the present invention.

First, an overview of the present invention will be described with reference to the drawings as needed. Meanwhile, the drawings and reference symbols of the drawings referred in this overview are shown as an example of exemplary embodiment, and are not intended to thereby limit variations of exemplary embodiments in accordance with the present invention.

According to a semiconductor device 10 of one exemplary embodiment of the present invention, as described in any of FIGS. 1 to 9, the semiconductor device 10 is provided with: a core substrate 11; at least one insulating layer (16, 18-1, 1.8-2) and at least one wiring layer (19a-d, 21, 22) which are disposed on each of a first surface (16, 18-1 side) of core substrate 11 and a second surface (18-2 side) opposite to the first surface; a via(s) (13, 17, 20) which is/are disposed in each of the insulating layer (16, 18-1, 18-2) and the core substrate 11, and connect(s) the wiring layers to each other; a semiconductor element 14 mounted on the first surface of the core substrate 11 with a surface for forming an electrode terminal facing up; and a connecting portion(s) 15 which penetrates the insulating layer 16 disposed on the first surface and directly connects the electrode terminal(s) 14a of the semiconductor element 14 and the wiring layer 19a disposed on the first surface, wherein a minimum wiring pitch of the wiring layer 19a directly connected to the connecting portion(s) 15 is smaller than that of any of the wiring layer(s) (19c, 19d, 22) disposed on the second surface. Meanwhile, the minimum wiring pitch of the present invention means a distance between centers of a wiring and the next wiring when the wirings having a minimum wiring width are wired in parallel at a minimum space.

According to the above-mentioned constitution, since an insulating layer is also disposed on the second surface opposite to the surface on which a semiconductor element is mounted, a warp in the whole semiconductor device can be reduced by an effect of the insulating layer on the second surface (see FIGS. 10A to 11B). Other components other than the above-mentioned semiconductor element or lands for BGA (Ball Grid Array) can be arbitrarily arranged also on the second surface or the like by forming a wiring layer on the second surface, so that design flexibility can be expanded. A minimum wiring pitch of the wiring layer 19a, which is directly connected to the electrode terminals 14a, is set to be as narrow as to match a pitch of the electrode terminals 14a on the surface of the semiconductor element 14. On the other hand, a minimum wiring pitch of the wiring layer(s) (19c, 19d, 22) of the second surface opposite to the surface, on which the semiconductor element is mounted, is set to be larger than a minimum wiring pitch of the wiring layer 19a. According to the above-mentioned constitution, the wiring layer(s) (19c, 19d, 22) of the second surface can be manufactured at a high yield. And an effect of improving a yield rate of the semiconductor device can be obtained by focusing on improving a yield rate of the wiring layer 19a.

Any of vias 20 disposed at the second surface is larger in shape than the connecting portion(s) 15. That is, a connection stability can be improved, and the semiconductor device 10 can be manufactured at a high yield by forming the connecting portion(s) 15, which is directly connected to the electrode terminal(s) 14a of the semiconductor element 14, to be small using a fine-fabrication, and forming each of the vias on the second surface to be larger than the connecting portion(s) 15.

A top diameter, a bottom diameter, and a height of each of the vias 20 disposed on the second surface are larger than a top diameter, a bottom diameter, and a height of the connecting portion(s) 15, respectively. That is, the top diameter of each of the vias 20 is larger than that of the connecting portion(s) 15; the bottom diameter of each of the vias 20 is larger than that of the connecting portion(s) 15; and the height of each of the vias 20 is larger than that of the connecting portion(s) 15. A volume of each of the vias 20 disposed on the second surface is three times or more of that of one connecting portion 15. According to adoption of these via configurations, resistance to a stress generated, when the semiconductor device is connected to an external mounting substrate or other components can be enhanced so that a semiconductor device having high reliability can be realized. Further, a thickness of the wiring layer 19a which is directly connected to the connecting portion 15 is thinner than that of any of wiring layers (19c, 19d, 22) disposed on the second surface. By forming the wiring 19a to be thin in thickness, fine wirings can be easily formed. And by forming the wiring layers (19c, 19d, 22) of the second surface, on which fine wirings are not needed, to be thick, it becomes possible to design a wiring resistance with a low impedance. It is preferable that a thickness, a minimum wiring width, and a minimum wiring interval of each of wiring layers (19c, 19d, 22) disposed on the second surface are one and a half times or more of a thickness, a minimum wiring width, and a minimum wiring interval of the wiring layer(s) 19a which is directly connected to the connecting portion(s) 15, respectively, because these give an effect for improving a yield rate of the semiconductor device.

Figure 4:
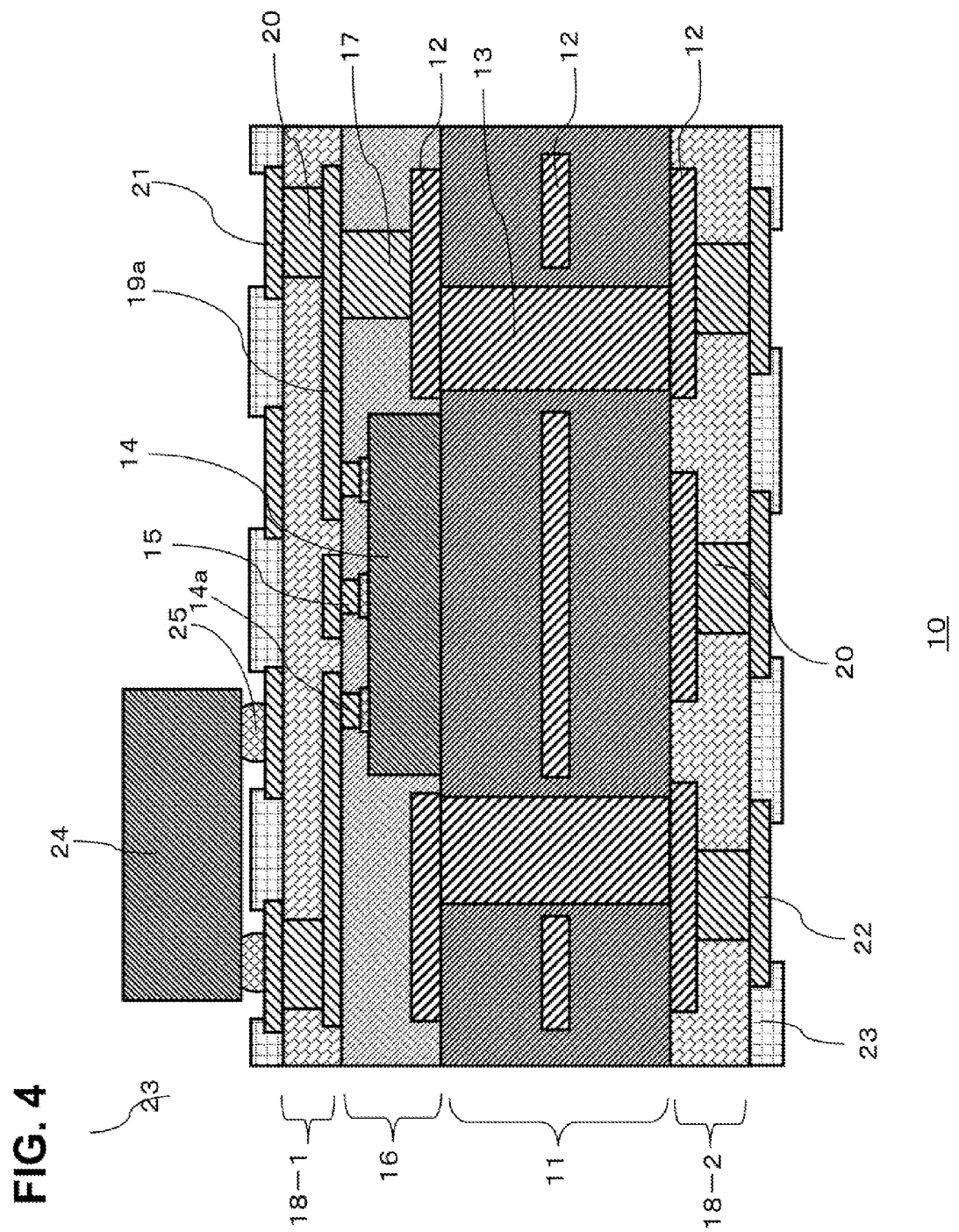
FIG. 4 is a sectional view of a semiconductor device in accordance with variation 2 of each of exemplary embodiments of the present invention.
Figure 5:
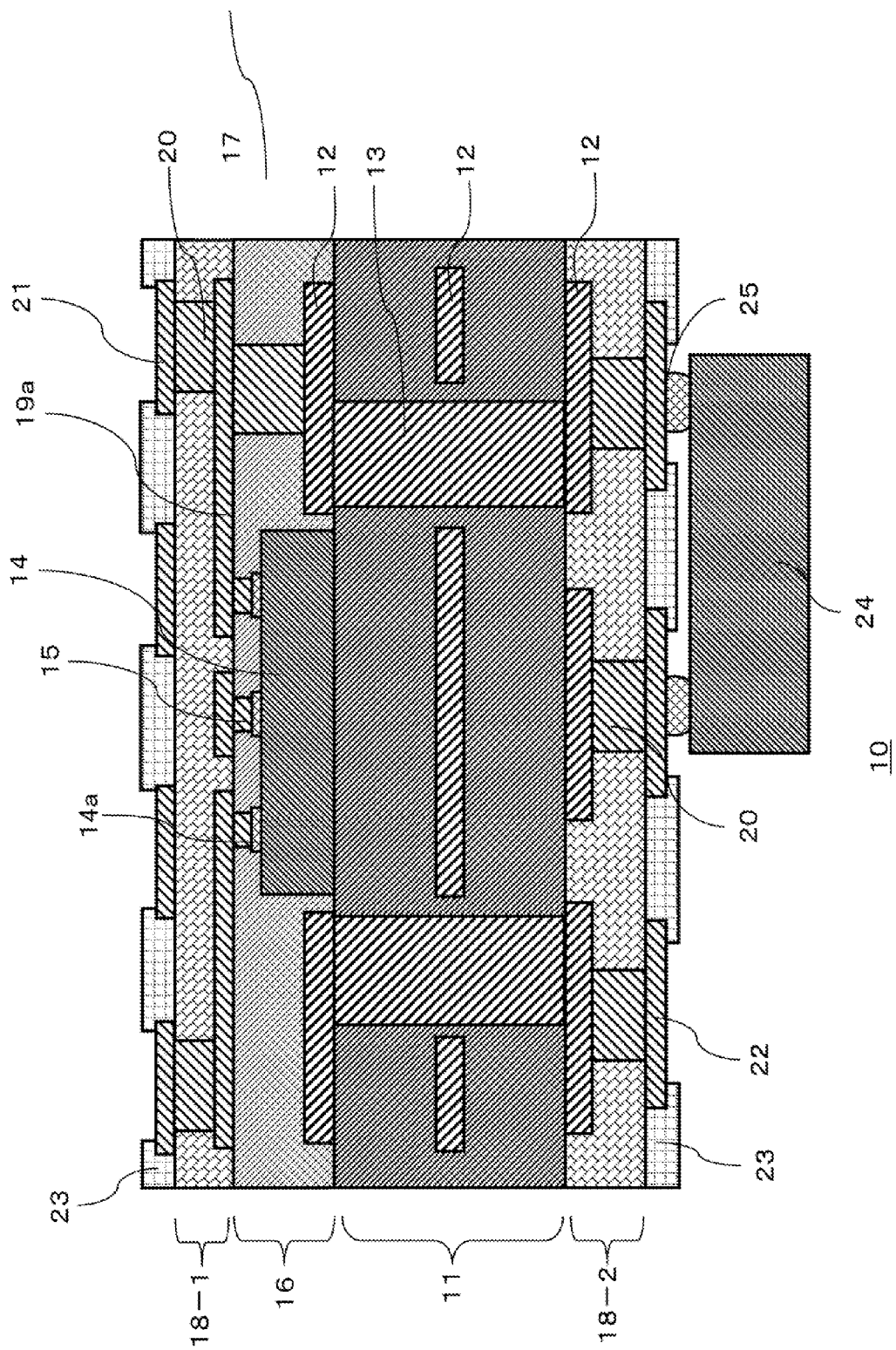
FIG. 5 is a sectional view of a semiconductor device in accordance with variation 3 of each of exemplary embodiments of the present invention.

A material of the insulating layer 16 around the connecting portion 15 is different from a material of the insulating layers (18-1, 18-2) not including the connecting portion 15. For example, by making the insulating layer 16 around the connecting portion 15 of a resin with a low coefficient of elasticity, a stress around the connecting portion 15, in which a fine fabrication is needed, can be reduced. The insulating layer 16 around the connecting portion 15 may be made of a photosensitive resin, and a resin layer disposed on the second surface may be made of a nonphotosensitive resin. According to this constitution, a photo-via using photo lithography can be adopted for the connecting portion 15. And since the photo-via can be formed to be finer than a laser via using laser processing, the photo-via can be applied to a narrow-pitch-connection to the semiconductor element 14. Further, as for vias disposed in the insulating layer on the second surface, by selecting to use a laser having a lower cost in a combination of material and process than a photo-via, it becomes possible to reduce cost of the whole semiconductor device. Differing from a photosensitive resin, a nonphotosensitive resin does not have a photosensitive function. Therefore, the nonphotosensitive resin is superior in mechanical characteristics as a resin material, rupture strength, coefficient of elasticity, rupture elongation percentage, or the like. So, by using the nonphotosensitive resin, a resistance to an external stress can be enhanced, and a long-term reliability of the semiconductor device can be enhanced. Further, it is preferable that the connecting portion 15 does not include a solder material and a resin component. By doing so, a narrow pitch connection and a high reliability connection can be realized. At least one insulating layer 18-2 and at least one wiring layer 22 on the second surface are disposed, respectively. If one insulating layer 18-2 is disposed, warp can be prevented. The insulating layer and the wiring layer on the first surface may be a single layer, respectively. The number of the insulating layers of the first surface and the number of the wiring layers of the first surface also can be determined as needed. That is, the insulating layer (16, 18-1) and the wiring layer (19a, 19b, 21) of the first surface may be multilayers having two or more layers respectively. In this case, a semiconductor element having many pins with a narrow pitch can be embedded. And since it becomes possible to enhance a power supply layer and a ground layer other than signal layers, a characteristic impedance can be improved. External electrodes (21, 22) are disposed on outermost wiring layers (21, 22) of the first surface and the second surface, respectively. That is, other electronic components or the like can be mounted to the external electrodes (21, 22), the semiconductor device can be connected through the electronic electrodes (21, 22) to other wiring board, and so on. A minimum pitch of the connecting portions 15 is narrower than minimum pitches of these external electrodes (21, 22). By applying a fine wiring and fine vias to the connecting portion 15, and applying a loose wiring and a large diameter via to the other layers, yield rate of the wiring body can be improved. As shown in FIGS. 4, 5, an electronic component 24 connected to the external electrodes (21, 22) is further included. If as shown in FIG. 4, the electronic component 24 is mounted on the first surface being the same surface as the semiconductor element 14, a high speed signal can be transmitted between the semiconductor element 14 and the electronic component 24. On the other hand, if as shown in FIG. 5, an electronic component 24 is mounted to the second surface not embedding the semiconductor element 14, it becomes possible that the electronic component 24 can be mounted onto the rigid core substrate 11 through only the single insulating layer 18-2, so that a mounting accuracy can be improved.

A recessed portion is formed on the first surface of the core substrate 11, and the semiconductor element 14 can be mounted in the recessed portion. In this case, the whole semiconductor device 10 can be thinner by enabling a height of the semiconductor element 14 to be lowered. Further, a plurality of semiconductor elements 14 may be mounted on the first surface of the core substrate 11 with a surface for forming element facing up. As described in FIGS. 6, 7, 8, a reinforcement material is disposed in at least one insulating layer among a plurality of insulating layers. The warp in the whole semiconductor device 10 and the chip can be effectively reduced by disposing a reinforcement material.

Figure 12A:
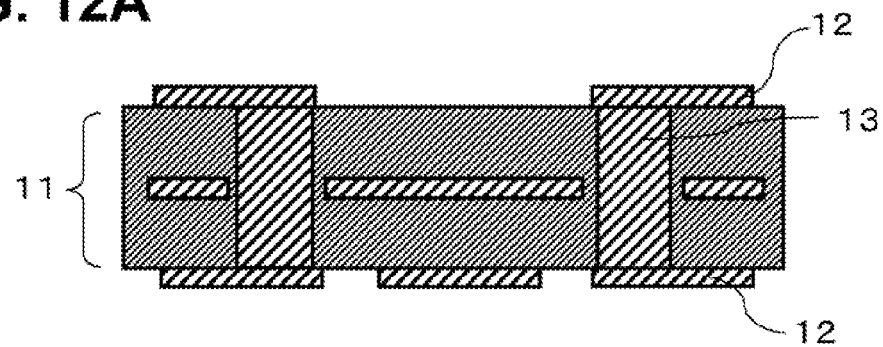
FIGS. 12A to 12C are sectional views of a manufacturing method of a semiconductor device in accordance with an exemplary embodiment 4 of the present invention.

As shown in FIGS. 12A to 18B, a method for manufacturing a semiconductor device in accordance with one exemplary embodiment of the present invention uses a core substrate 11 in which core wirings 12 are disposed on a surface of a first surface and a surface of a second surface opposite to the first surface, and penetrating vias 13 connecting the core wirings 12 of the first surface and the second surface are further disposed (see FIG. 12A etc.). The method for manufacturing a semiconductor device comprises: mounting a semiconductor element 14 on the first surface of a core substrate 11 with a surface for forming electrode terminal(s) 14a facing up (FIG. 12B); forming a first insulating layer, with which the semiconductor element 14 is covered, on the first surface (FIG. 12C); a first wiring forming step, forming a first wiring layer 19a on a surface of the first insulating layer, and forming a wiring(s) connected to the electrode terminal(s) 14a of the semiconductor element 14 through a connecting portion(s) 15 and a wiring(s) connected to the core wiring(s) 12 disposed on the first surface through a via(s) 17 on the first wiring layer 19a (FIG. 13A); forming a second insulating layer 18-2 on the second surface; and a second wiring forming step, forming a second wiring layer 22 on a surface of the second insulating layer 18-2, and forming a wiring(s) connected to the core wiring(s) 12 disposed on the second surface through vias 20 on the second wiring layer (FIG. 13B), wherein a set of the step of forming the first insulating layer 16 and the first wiring (19a, 21 of FIG. 17) forming step, and a set of the step of forming the second insulating layer 18-2 and the second wiring (19c, 19d, 22) forming step are carried out in different steps.

That is, as described in Patent Document 2, it has been conventionally thought that in a case where insulating layer and wiring layer are formed on the two sides of the core substrate 11, even in a substrate with built-in semiconductor element, forming the insulating layer and the wiring layer simultaneously on the two sides leads to shortening of the processing steps. However, if the insulating layer and the wiring layer are formed simultaneously on both the two sides, fabrication precisions on both the two sides are also identical. Therefore, minimum wiring pitches on the two sides are equal, and minimum shapes of vias of the two sides are also identical. In a manufacturing method in accordance with the above-mentioned exemplary embodiment, since a fabrication precision needed for the connecting portions 15 directly connected to the electrode terminals 14a of the semiconductor element 14, and wirings 19a directly connected to the connecting portion 15 is different from that needed for vias 20 and the wiring layer (19c, 19d, 22) disposed at the second surface, a set of the of step of forming the first insulating layer 16 and the first wiring 19a forming step, and a set of the step of forming the second insulating layer 18-2 and the second wiring 22 forming step are carried out in different steps. By doing so, an optimum method for each of a fine fabrication and a cost reduction can be selected. For example, a fine wiring can be formed by means of additive method in the first wiring forming step, and wirings can be formed at low cost by means of subtractive method in the second wiring forming step.

Further, as shown in FIGS. 14A-15C, 18A and 18B, a step of mounting the semiconductor element 14 is carried out after forming the second insulating layer 18-2. This is because, since the semiconductor element 14 is the highest-priced component among components included in the semiconductor device 10 in most cases, a non-defective semiconductor element 14 can be prevented from being scrapped due to defects of other than the semiconductor element 14 by mounting the semiconductor element 14 in a step order in which a defect rate of the semiconductor device 10 is as low as possible. In other words, this is because if some defects occur during the step of forming insulating layer or the step of forming wiring layer after mounting the semiconductor element 14 on the core substrate 11, in many cases it is difficult to stably perform a repair process including repairing the defect itself or removing the semiconductor element 14 from the core substrate 11 so as to mount it onto another core substrate 11.

Figure 18A:
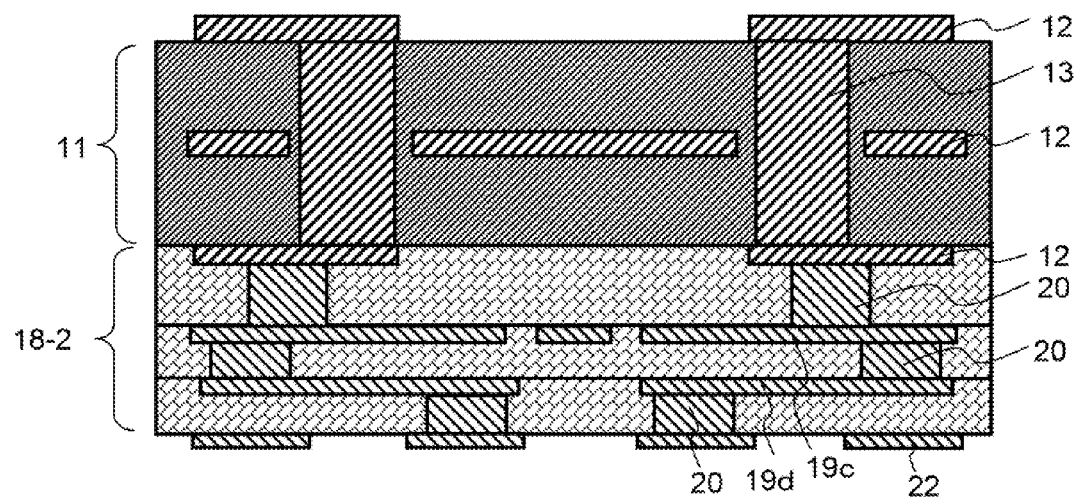
FIGS. 18A and 18B are sectional views of a manufacturing method of a semiconductor device in accordance with an exemplary embodiment 6 of the present invention.
Figure 18B:
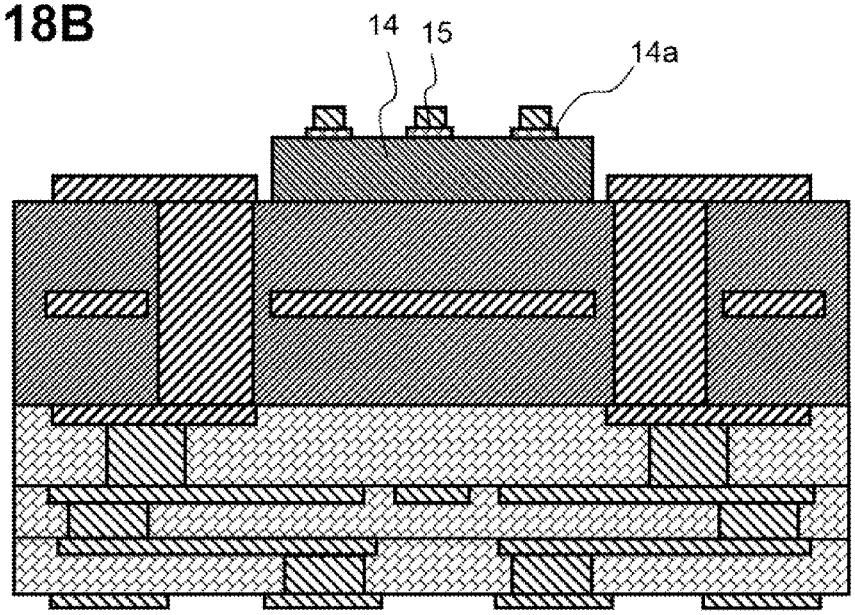
Figure 19:
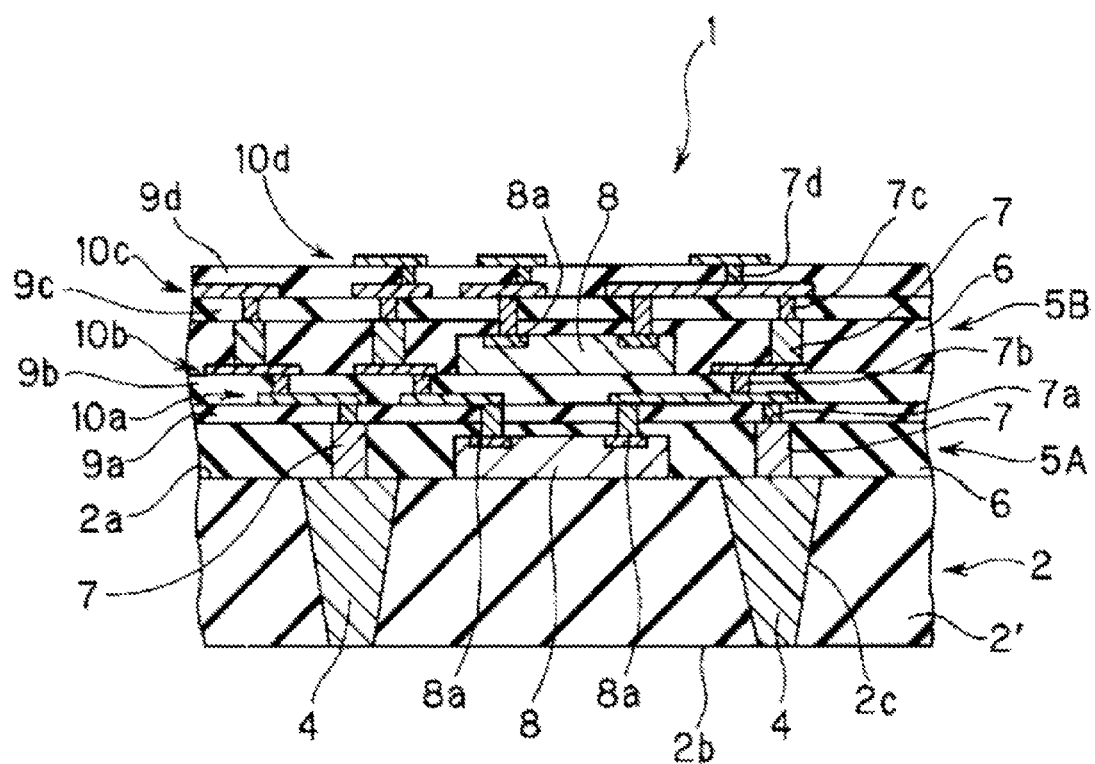
FIG. 19 is a sectional view of a conventional semiconductor device described in Patent Document 1.
Figure 20:
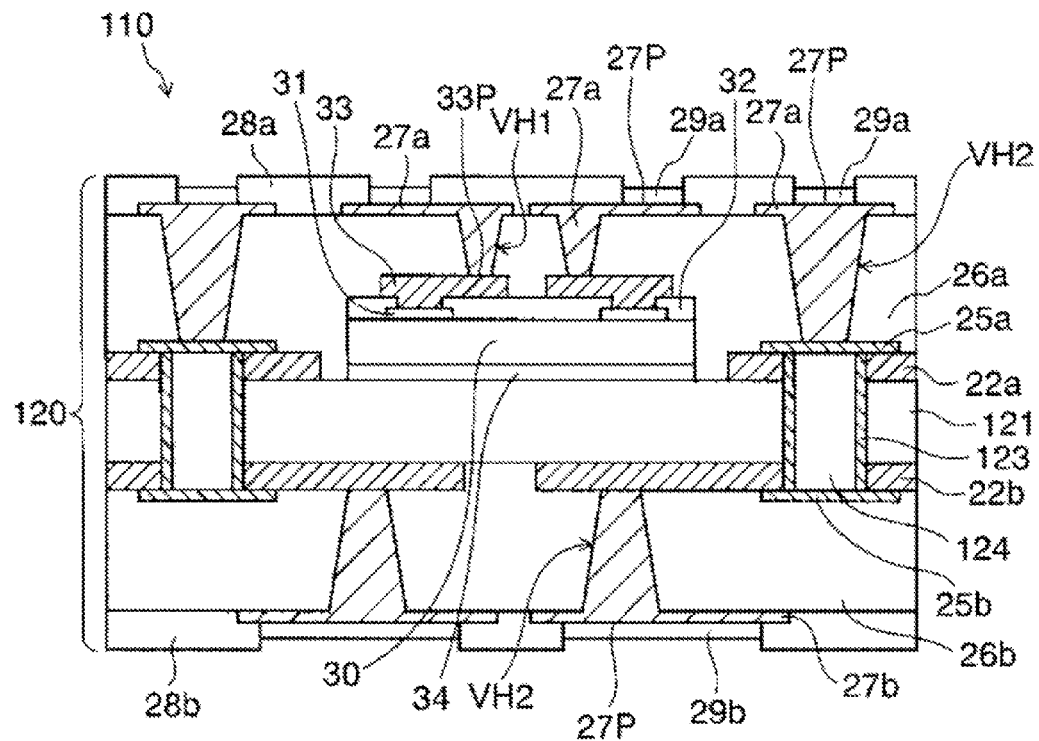
FIG. 20 is a sectional view of a conventional semiconductor device described in Patent Document 2.

As shown in FIGS. 18A and 18B, a step of mounting the semiconductor element 14 can be carried out after forming second wirings 19c. That is, a non-defective semiconductor element 14 can be prevented from being scrapped (wasted) due to defects of other than the semiconductor element 14 by mounting the semiconductor element 14 on the first surface after forming the insulating layer and the wiring layer at the second surface. Furthermore as shown in FIGS. 18A and 18B, after forming second wirings 19c, an insulating layer 18-2 and a wiring layer 19d are further stacked on a surface of the second wiring layer 19c of the second surface. And after a multilayer wiring formation of the second surface is completed, a step of mounting the semiconductor element 14 can be carried out, too.

After forming the first insulating layer 16, a via hole(s) from a surface of the first insulating layer 16 to the electrode terminal 14a of the semiconductor element 14 and a via hole(s) from the surface of the first insulating layer 16 to the core wiring 12 disposed on the first surface are formed. And the connecting portion(s) 15 and the via(s) 17 are formed by filling up the via holes with conductive layers. The first insulating layer 16 may be made of a photosensitive resin, and fine vias can be formed by means of photo lithography. And the second insulating resin may be made of a nonphotosensitive resin, and vias can be formed at low cost using a laser. The semiconductor element 14 may have a metal post(s) 15 disposed on a surface of the electrode terminal(s) 14a. And the first wiring forming step (for example, FIG. 13A) may include a step of removing part of the first insulating layer 16 so that a surface of the metal post(s) 15 is exposed, and a step of forming the connecting portion 15 by the metal post(s) 15.

A step of forming the first insulating layer 16 which covers the semiconductor element 14 (for example, FIG. 12C) may include a step of covering an outer peripheral portion of the semiconductor element 14 with a first insulating resin, and a step of covering a surface of the semiconductor element 14 with a second insulating resin. Each of the exemplary embodiments of the present invention will be described in more detail below with reference to the drawings.

(First Exemplary Embodiment)

FIG. 1 is a sectional view illustrating a configuration of a semiconductor device 10 in accordance with an exemplary embodiment 1. A semiconductor device 10 of FIG. 1 is provided with a core substrate 11 in which core wirings 12 of the two sides are conductive through a penetrating via(s) 13, a semiconductor element 14 disposed on the first surface of the core substrate 11, a built-in layer 16 embedding the semiconductor element 14, and wirings 19a disposed on the surface of the built-in layer 16. Electrode terminals 14a are disposed on the surface of the semiconductor element 14, and connecting portions 15 are connected to the electrode terminals 14a. The wirings 19a and the electrode terminals 14a of the semiconductor element 14 are connected through the connecting portions 15. The wirings 19a disposed on the surface of the built-in layer 16 and the core wiring 12 are connected through a built-in layer via(s) 17 disposed in the built-in layer 16. An insulating layer A (18-1) is disposed on the top surface of the built-in layer 16, and a first electrode 21 and the wiring(s) 19a are connected through a via(s) 20. Further, an insulating layer B (18-2) is disposed on a second surface of the core substrate 11 opposite to the surface on which the built-in layer 16 is disposed, and a second electrode(s) 22 and the core wiring 12 are connected through a via(s) 20. Further, solder resists 23 are disposed on two sides of the semiconductor device 10 so that the first electrode(s) 21 and the second electrode(s) 22 are left open. Meanwhile, in this description, a surface of the core substrate 11 on which the semiconductor element 14 is mounted is referred to as a first surface, and the opposite surface is referred to as a second surface. However, in the present description, the first surface and the second surface do not mean more than that. Although not illustrated in FIG. 1, wirings may be wired (laid-out) at a conductive layer being the same layer as the first electrode 21 and/or a conductive layer being the same layer as the second electrode 22. In this case, the conductive layer being the same layer as the first electrode 21 and/or the conductive layer being the same layer as the second electrode 22 become wiring layers respectively.

Figure 3:
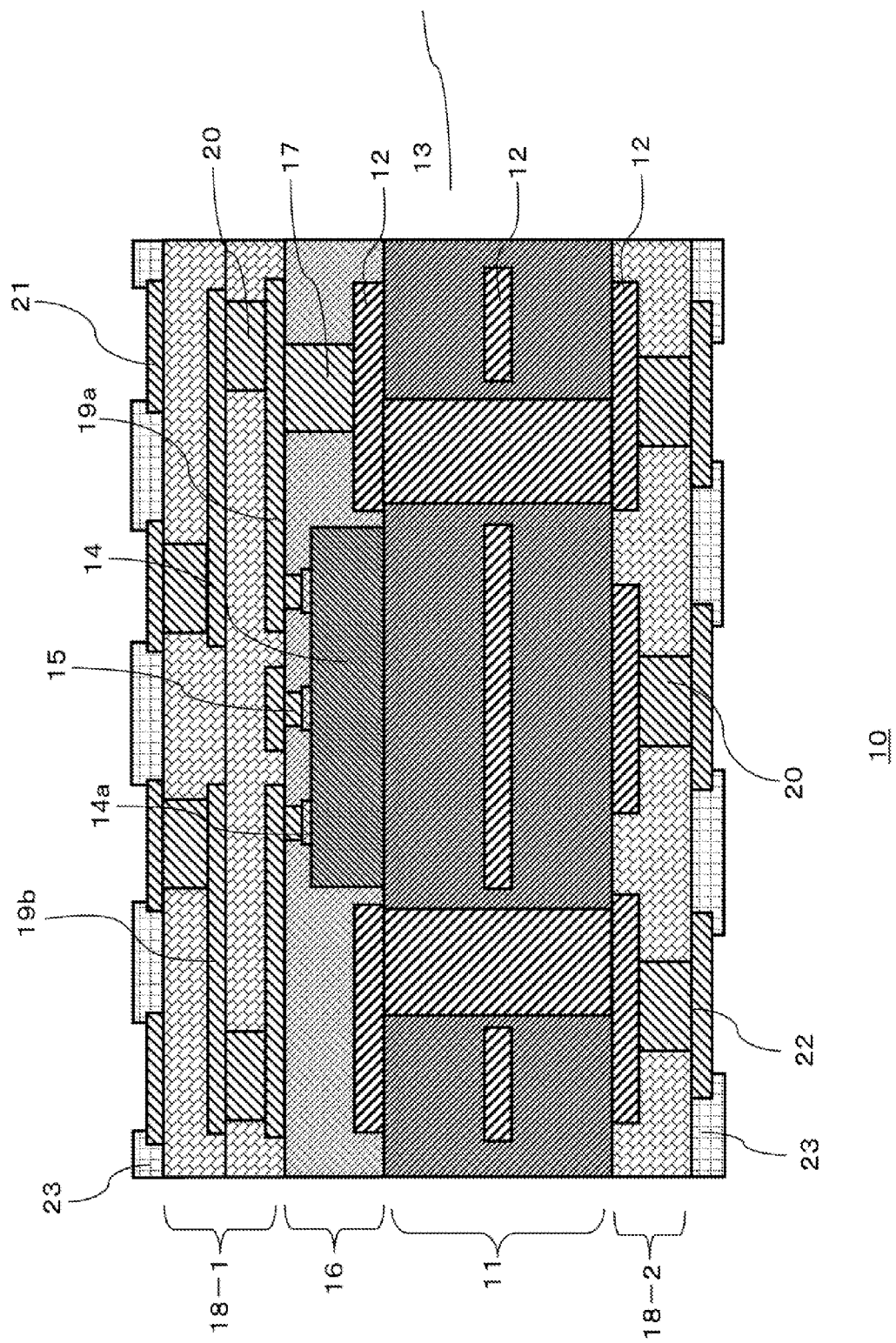
FIG. 3 is a sectional view of a semiconductor device in accordance with variation 1 of the exemplary embodiment 1 of the present invention.

As shown in FIG. 3, the insulating layer A (18-1) may be of a plurality of layers. In the case, a semiconductor element having many pins with a narrow pitch can be embedded. Since it becomes possible to enhance a power supply layer and a ground layer other than signal layers, a characteristic impedance can be improved.

Figure 6:
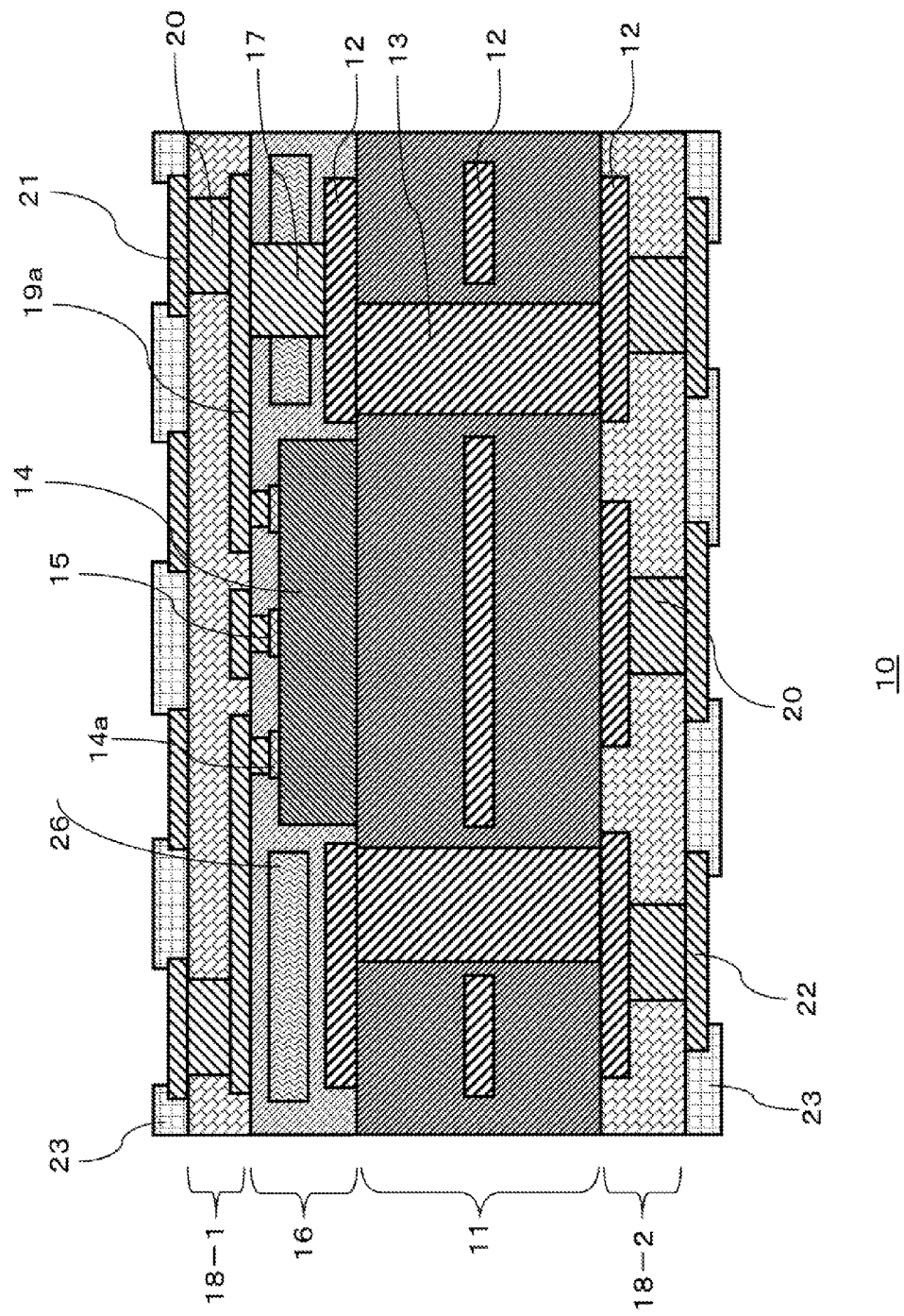
FIG. 6 is a sectional view of a semiconductor device in accordance with variation 4 of each of exemplary embodiments of the present invention.

As shown in FIG. 6, a reinforcement material 26 may be disposed in the built-in layer 16 so as to surround the semiconductor element 14. In the case, a warp in the whole semiconductor device 10 and the chip can be reduced effectively.

Figure 7:
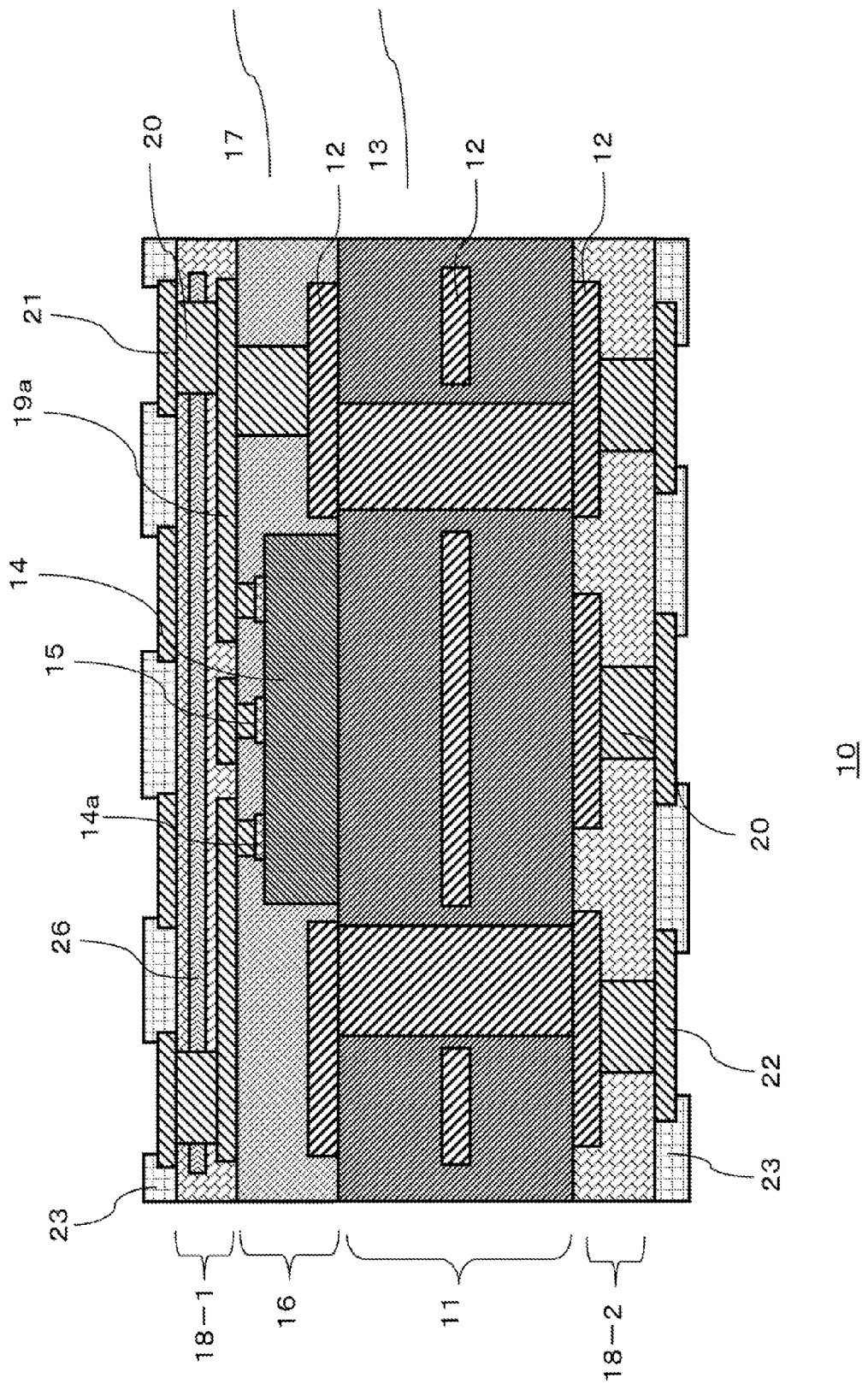
FIG. 7 is a sectional view of a semiconductor device in accordance with variation 5 of each of exemplary embodiments of the present invention.

As shown in FIG. 7, a reinforcement material 26 may be disposed in the insulating layer A (18-1). In this case, a warp in the whole semiconductor device 10 can be reduced effectively.

Figure 8:
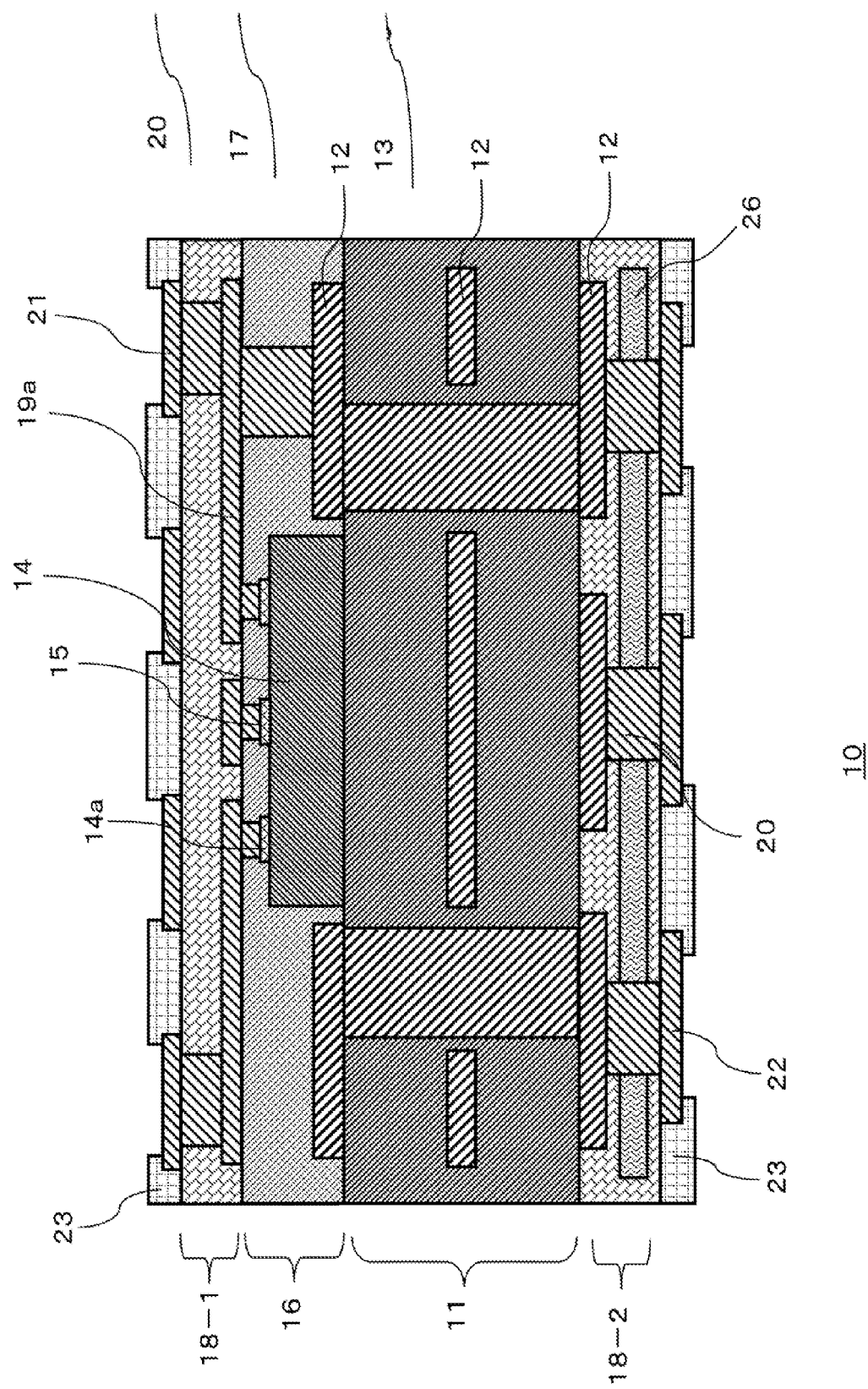
FIG. 8 is a sectional view of a semiconductor device in accordance with variation 6 of each of exemplary embodiments of the present invention.

As shown in FIG. 8, the reinforcement material 26 may be provided in the insulating layer B (18-2). In this case, a warp in the whole semiconductor device 10 can be reduced effectively.

Figure 11A:
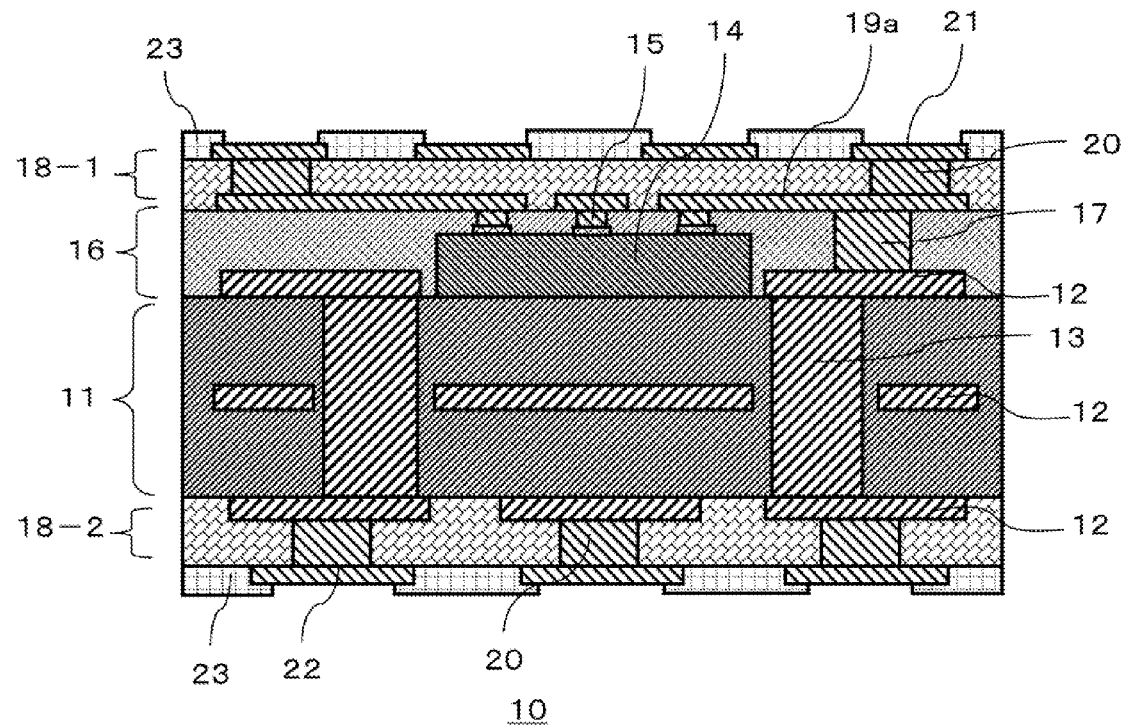
FIGS. 11A and 11B are figures illustrating a warp in one embodiment of the present invention.
Figure 11B:
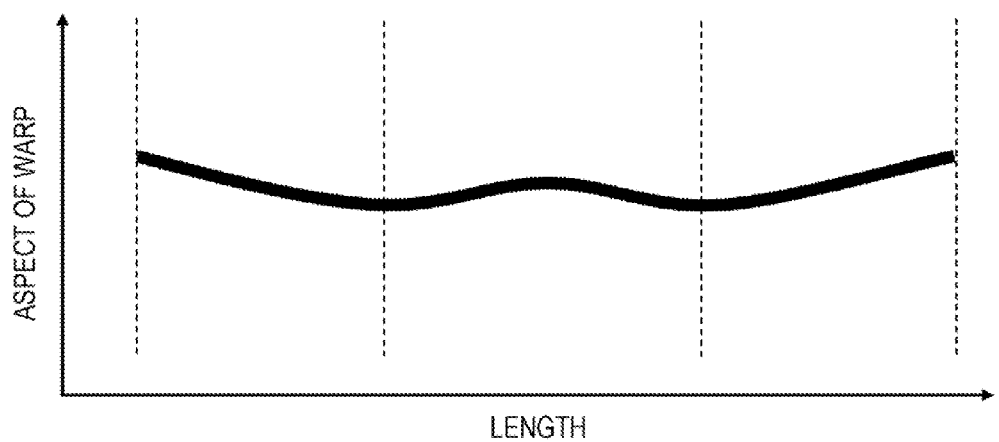

Here, a substrate with built-in semiconductor element, in which the core substrate 11 is used as a support medium, will be considered. If the semiconductor element 14 is embedded in one surface (the first surface) of the core substrate 11, and a resin layer (the insulating layer B18-2) is not disposed on the opposite surface (the second surface), as shown in the FIGS. 10A and 10B, a warp in the whole semiconductor device 10 and the portion around the chip is generated greatly in a concave and convex fashion due to the relation among coefficients of thermal expansion and coefficients of elasticity of among constituent materials. Therefore, there have been problems with regard to mounting other components on the semiconductor device 10, mounting the semiconductor device 10 to a mother board, and a long term reliability of the semiconductor device 10. On the other hand, as shown in FIGS. 11A and 11B, a warp in the whole semiconductor device 10 and the portion around the chip can be suppressed by providing a resin layer (insulating layer B18-2) on the surface opposite to the built-in surface of the semiconductor element 14. Since the second electrode terminals 22 can be disposed on the insulating layer B (18-2) through vias 20, external electrodes can be formed with a high design flexibility.

Although not illustrated, the semiconductor element 14 may be embedded in the first surface of the core substrate 11. In this case, since a thickness of the resin of the built-in layer 16 can be thinner, a warp in the semiconductor device 10 can be suppressed. Since an aspect ratio of the built-in layer via 17 can be set to be small, the built-in layer via 17 can be manufactured at a high yield.

The built-in layer 16, the insulating layer A (18-1), and the insulating layer B (18-2) may be made of different insulating materials from one another. For example, if an insulating material of the insulating layer B (18-2) is selected so that the elasticity is higher than those of insulating materials of the built-in layer 16 and the insulating layer A (18-1), a warp in the whole semiconductor device 10 can be suppressed.

As shown in FIGS. 4, 5, an electronic component 24 can be mounted on the semiconductor device 10 through a bonding material 25. The electronic component 24 may be mounted on either side of the first electrode 21 or the second electrode 22. However, it is preferable that the electronic component 24 is mounted on the first electrode terminal 21, and the second electrode terminal 22 is used for BGA in order to realize a high speed transmission between the semiconductor element 14 and the electronic component 24 by shortening the distance between the embedded semiconductor element 14 and the electronic component 24. In this case, since fine vias and fine wirings are not needed in the insulating layer B (18-2) opposite to the built-in layer 16, it is preferable that a via shape of via 20 in the insulating layer B (18-2) and a wiring shape of the second electrode 22 are larger than a via shape of the connecting portion 15 and a wiring shape of the wiring layer 19a, in which the wiring and the via concerned are most closely disposed from an electrode surface of the semiconductor element 14. Furthermore, in this exemplary embodiment, a manufacturing technique having a high yield is secured by limiting the insulating layer B (18-2) to a single layer. By doing so, a yield rate of the insulating layer B (18-2) and a yield rate of the semiconductor device 10 can be improved.

Here, the term "via shape" means a top diameter, a bottom diameter, and a height of the via. And the term "wire shape" means a wiring width and a pitch between wirings, that is, so-called wiring rule, and a thickness of wiring.

For example, the core substrate 11 is made of a resin substrate, a silicon, a ceramic, a glass, a glass-epoxy complex, or the like. Particularly, from a viewpoint of cost and warp control, an organic resin substrate, a glass-epoxy complex or the like are preferable. In the present exemplary embodiment, the core substrate 11 is made of a rigid (or tough) glass-epoxy complex. The number of wiring layers of the core substrate 11 is not limited to 2 layers for each of two sides, and a multilayer configuration is preferable. In the present exemplary embodiment, the number of wiring layers of the core substrate 11 is set to be 4. In order to improve a yield rate of the semiconductor device 10, it is preferable that a non-defective inspection for a manufactured core substrate 11 is carried out before mounting the semiconductor element 14. As mentioned above, in a case where the electronic component 24 is mounted to the first electrode 21, and BGA is mounted to the second electrode 22, any specification of the core substrate 11, for example, wiring rule (L/S), via pitch, and via size may suffice, in which a high yield is realized for mass production (L/S: 50 μm/50 μm, via pitch: 1 mm, via size: 100 μm). It becomes possible to reduce the cost of the semiconductor device by using such a core substrate having a high yield.

The thickness of the semiconductor element 14 can be adjusted based on the thickness needed for the whole semiconductor device 10. In the present exemplary embodiment, the thickness of the semiconductor element 14 is set to be 50 μm. The number of the semiconductor elements 14 is one in FIG. 1. However, it may be plural. In the present exemplary embodiment, the number of semiconductor elements 14 which is embedded in the built-in layer 16 is set to be one.

It is preferable that a die attachment film (DAF), an insulating paste or a silver paste is used as a bonding layer between the semiconductor element 14 and the core substrate 11. In the present exemplary embodiment, DAF is used. It is preferable that a region on which the semiconductor element 14 of the core substrate 11 is mounted is a region in which the core wiring 12 does not exist in order to secure an adhesion.

For example, the built-in layer 16, the insulating layer A (18-1), and the insulating layer B (18-2) are made of a photosensitive or nonphotosensitive organic material. For example, an epoxy resin, epoxy acrylate resin, an urethane acrylate resin, a polyester resin, a phenol resin, a polyimide resin, BCB (benzocyclobutene), PBO (polybenzoxazole), a polynorbornene resin, or the like may be used as the organic material. Alternatively, a material obtained by an impregnating woven fabric or a nonwoven fabric formed of a glass cloth, an aramid fiber, or the like with an epoxy resin, an epoxy acrylate resin, an urethane acrylate resin, a polyester resin, a phenol resin, a polyimide resin, PCB (benzocyclobutene), PBO (polybenzoxazole), a polynorbornene resin, or the like may be used as the organic material. The built-in layer 16 may be made of a photosensitive resin, and the insulating layer B (18-2) may be made of a nonphotosensitive resin. By doing so, the connecting portion 15 formed in the built-in layer 16 can be fine-fabricated as a photo via, and the via 20 formed in the insulating layer B (18-2) also can be fabricated at low cost using a laser such as a UV-YAG laser and a $CO_2$ laser. In the present exemplary embodiment, the built-in layer 16, the insulating layer A (18-1), and the insulating layer B (18-2) are made of an epoxy resin being a nonphotosensitive resin.

For example, the core wiring 12, the wiring 19, the first electrode 21, and the second electrode 22 are made of at least one metal selected from the group consisting of copper, silver, gold, nickel, aluminum, and palladium or an alloy primarily containing these elements as a major constitute(s). In particular, it is preferable that they are made of copper, from a viewpoint of the electrical resistance value and cost. In the present exemplary embodiment, the core wiring 12, the wiring 19, the first electrode 21, and the second electrode 22 are made of copper.

For example, the penetrating via 13, the built-in layer via 17, and via 20 are made of at least one metal selected from the group consisting of copper, silver, gold, nickel, aluminum, and palladium or an alloy primarily containing these elements. In particular, it is preferable that they are made of copper, from a viewpoint of the electrical resistance value and cost. In the present exemplary embodiment, the penetrating via 13, the built-in layer via 17 and via 20 are made of copper.

A capacitor functioning as a circuit noise filter may be provided at a desired position in each layer. It is preferable that examples of the dielectric material used to form such capacitor include: metal oxide such as titanium oxide, tantalum oxide, $Al_2O_3$, $SiO_2$, $ZrO_2$, $HfO_2$, or $Nb_2O_5$; perovskite-type material such as BST ($Ba_xSr_{1-x}TiO_3$), PZT ($PbZr_xTi_{1-x}O_3$), or PLZT($Pb_{1-y}La_yZr_xTi_{1-x}O_3$); and Bi-based layer compound such as $SrBi_2Ta_2O_9$ ($0 \leq x \leq 1$, $0 < y < 1$). An organic material or the like to which an inorganic material or a magnetic material is added may be used as the dielectric material forming the capacitor. And other than the semiconductor element and the capacitors, discrete components may be arranged, too.

According to the present exemplary embodiment, since a rigid core substrate is used for a support medium in a substrate with built-in semiconductor element embedding a semiconductor element, a semiconductor device having a high yield can be realized. Since a single insulating layer is disposed on the surface opposite to the built-in layer, a warp in the semiconductor device can be reduced.

(Second Exemplary Embodiment)

Figure 2:
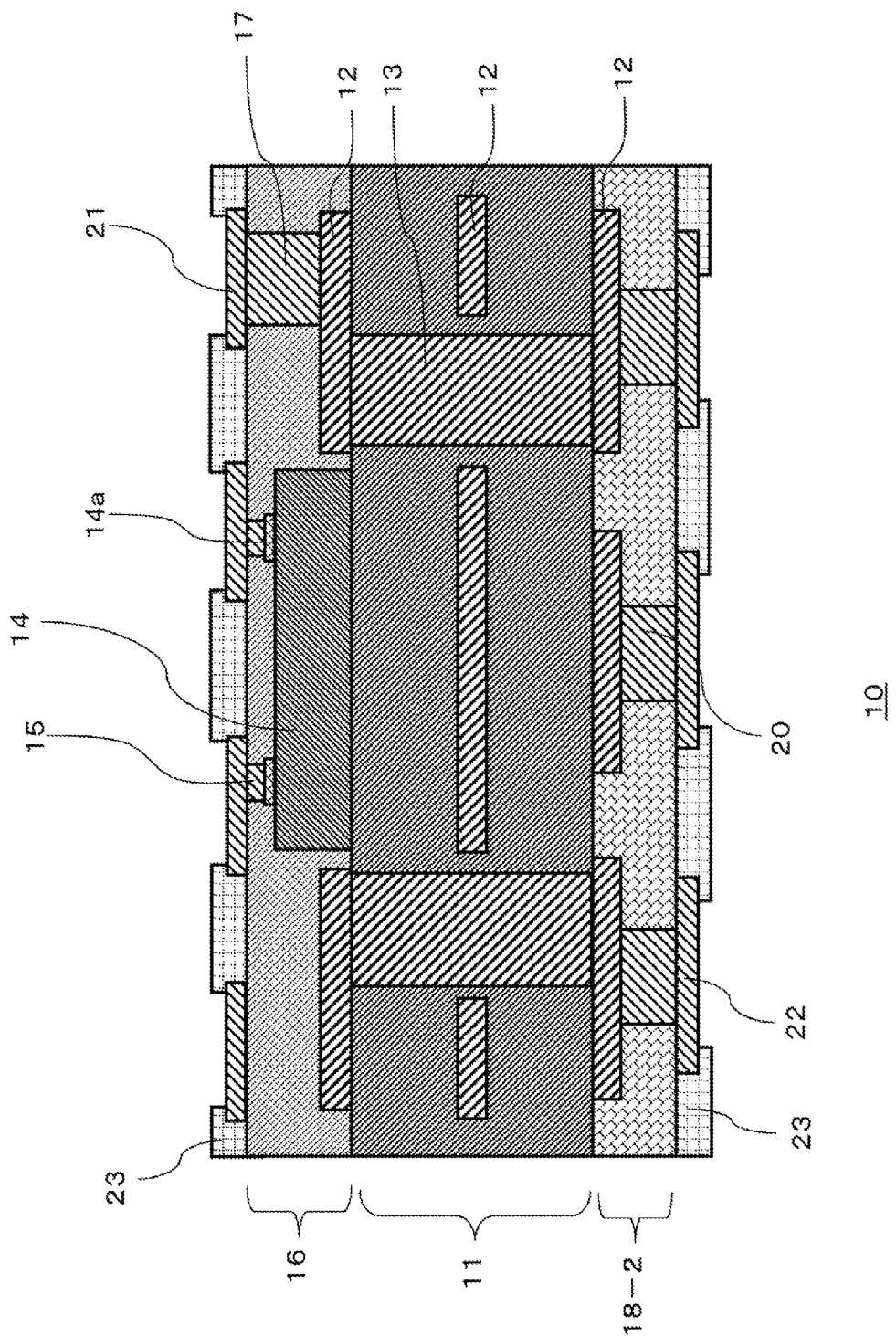
FIG. 2 is a sectional view of a semiconductor device in accordance with an exemplary embodiment 2 of the present invention.

Next, a semiconductor device in accordance with an exemplary embodiment 2 of the present invention will be described. FIG. 2 is a partial sectional view illustrating the semiconductor device 10 in accordance with the exemplary embodiment 2. A difference of the semiconductor device 10 in accordance with the exemplary embodiment 2 from the semiconductor device 10 in accordance with the exemplary embodiment 1 resides in that the insulating layer A (18-1) is not needed on the first surface of the core substrate 11, and the semiconductor device 10 is constituted by only the built-in layer 16. The different points from the semiconductor device 10 in accordance with the exemplary embodiment 1 will be described below. With respect to the points not described in particular, the semiconductor device 10 in accordance with the exemplary embodiment 2 is identical to that in accordance with the exemplary embodiment 1. Reinforcement materials are not disposed in the insulating materials of the built-in layer 16 and the insulating layer B (18-2) in FIG. 2. However, reinforcement materials may be provided, too, as shown in FIGS. 6, 8.

Since only the built-in layer 16 and the insulating layer B (18-2) exist on the two sides of the core substrate 11 by disposing only the built-in layer 16 on the surface in which the semiconductor element 14 is embedded (first surface), a warp in the semiconductor device 10 can be more reduced. Since the number of wiring layers other than the core substrate 11 becomes one for each of the two sides, the number of factors that deteriorate a yield is reduced so that the semiconductor device 10 can be manufactured at a high yield.

According to the present exemplary embodiment, since a rigid core substrate 11 is used as a support medium in a substrate with built-in semiconductor element embedding the semiconductor element 14, a semiconductor device having a high yield can be realized. Since one insulating layer and one wiring layer are disposed on each of the two sides of the core substrate 11, a yield rate and a warp reduction of the semiconductor device can be extremely improved.

(Third Exemplary Embodiment)

Figure 9:
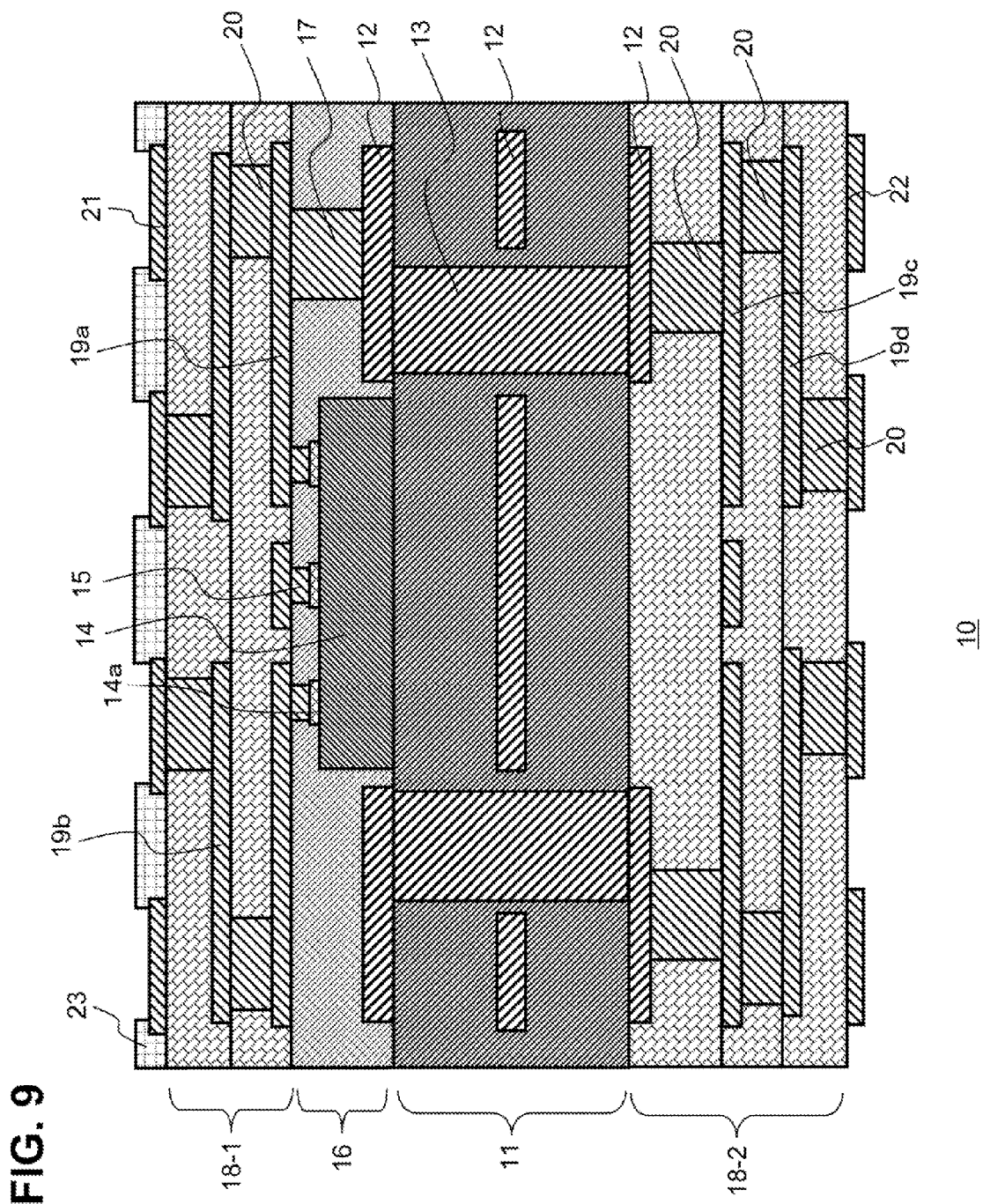
FIG. 9 is a sectional view of a semiconductor device in accordance with an exemplary embodiment 3 of the present invention.
Figure 10A:
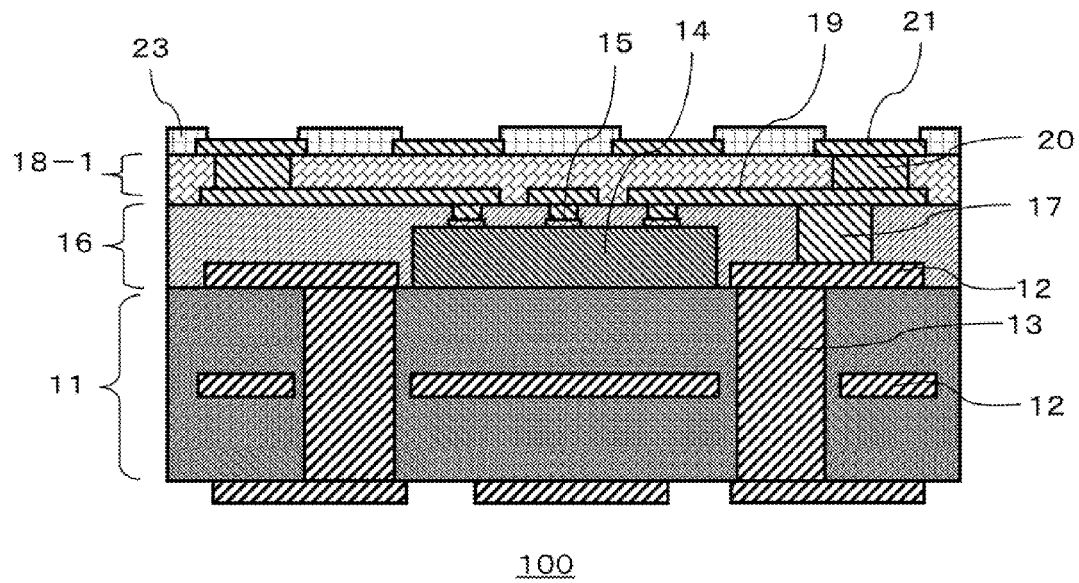
FIGS. 10A and 10B are figures illustrating a warp in a conventional semiconductor device in which a resin layer is provided only on one side of a substrate with built-in semiconductor element.
Figure 10B:
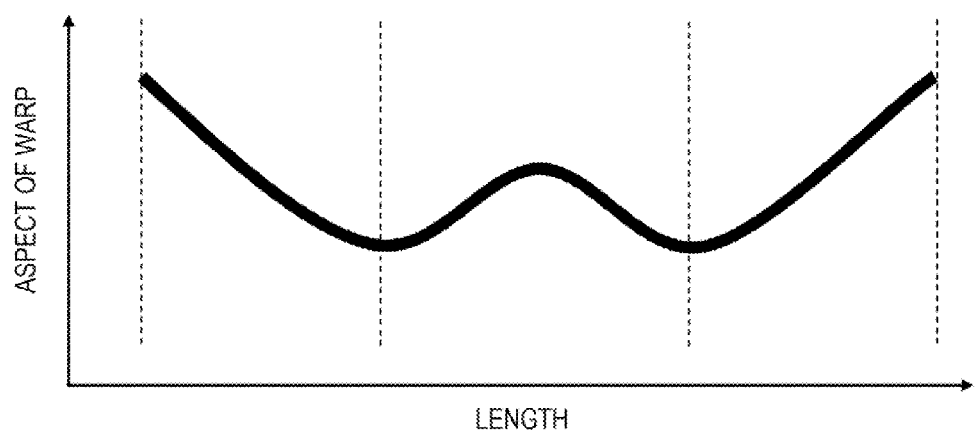

FIG. 9 is a sectional view of a main part of a semiconductor device in accordance with an exemplary embodiment 3. A difference of the semiconductor device 10 in accordance with the exemplary embodiment 3 from the exemplary embodiment 1 resides in that the multi-insulating layer B (18-2) and multi-wiring layers 19c, 19d are disposed on the second surface opposite to the surface on which the semiconductor element 14 is mounted. Meanwhile, 19c is the lowermost wiring layer among wiring layers of the second surface, and 19d is an "upper" wiring layer than 19c. According to the exemplary embodiment 3, since multi-wirings are disposed also on the second surface opposite to the surface on which the semiconductor element 14 is mounted, even in a case where the number of terminals of the semiconductor element 14 is larger, wirings with high flexibility can be formed. Also in the second surface, the semiconductor element 14 can be shielded from noise by enhancing the power supply layer and the ground layer or providing a shield layer. According to a manufacturing method mentioned later, the semiconductor device 10 in accordance with the exemplary embodiment 3 also can be manufactured at a high yield with respect to yield after mounting the semiconductor element 14 on the core substrate 11. Although the solder resist 23 is not provided on a surface having the second electrode 22 formed of the second surface in FIG. 9, the solder resist 23 can be provided also on the outermost layer of the second surface as needed like the exemplary embodiment 1.

(Fourth Exemplary Embodiment)

Next, an exemplary embodiment of a method for manufacturing a semiconductor device 10 will be described. FIGS. 12A to 12C, FIGS. 13A, 13B are sectional views illustrating, in the order of step sequence, a method for manufacturing the semiconductor device 10 in accordance with an exemplary embodiment 4. FIGS. 13A, 13B illustrate steps following FIGS. 12A to 12C. According to the manufacturing method in accordance with the present exemplary embodiment, the semiconductor device 10 of the exemplary embodiment 1 (FIG. 1) can be manufactured.

First, as shown in FIG. 12A, the core substrate 11, in which core wirings 12 on the two sides are connected through a penetrating via(s) 13, is provided. It is preferable that the core substrate is made of a high-rigid material. It is preferable that a non-defective inspection has been completed for the core substrate. It is preferable that a positioning mark for mounting the semiconductor element 14 is arranged on the core substrate 11. As long as the positioning mark can be recognized precisely and can function properly as a positioning mark, the positioning mark may be arranged by depositing a metal on the core substrate 11 or by forming a depression through wet etching or mechanical processing. In the present exemplary embodiment, the core substrate is made of a glass-epoxy complex with a thickness of 0.8 mm and four wiring layers, and the core wiring 12 is used for the positioning mark.

Figure 12B:
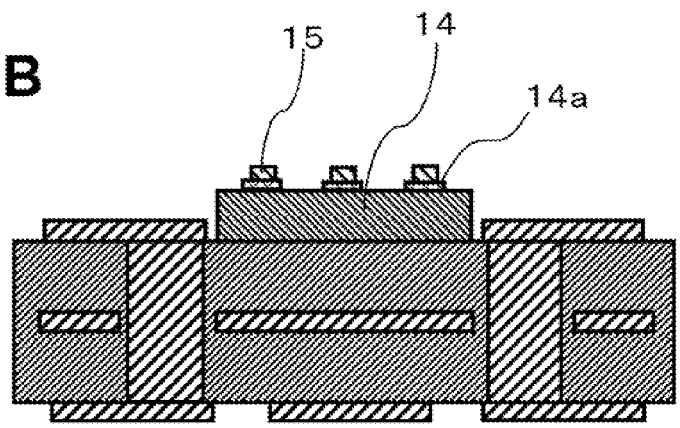
Figure 13A:
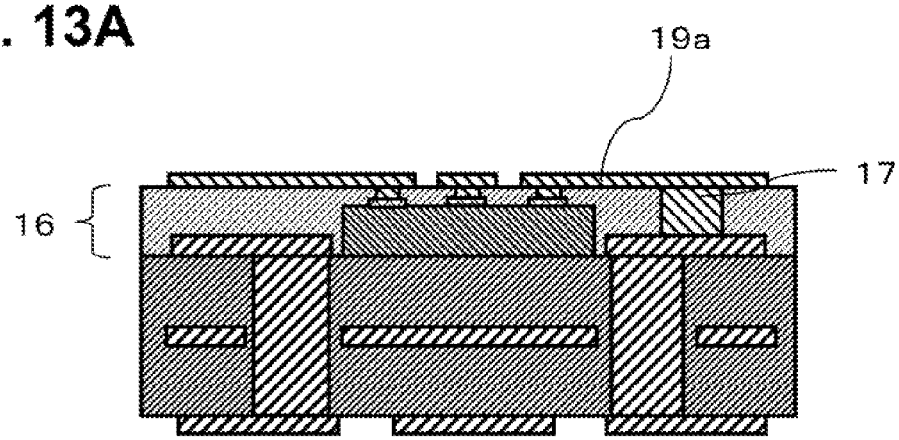
FIGS. 13A and 13B are continuation of the sectional views in accordance with the exemplary embodiment 4.
Figure 13B:
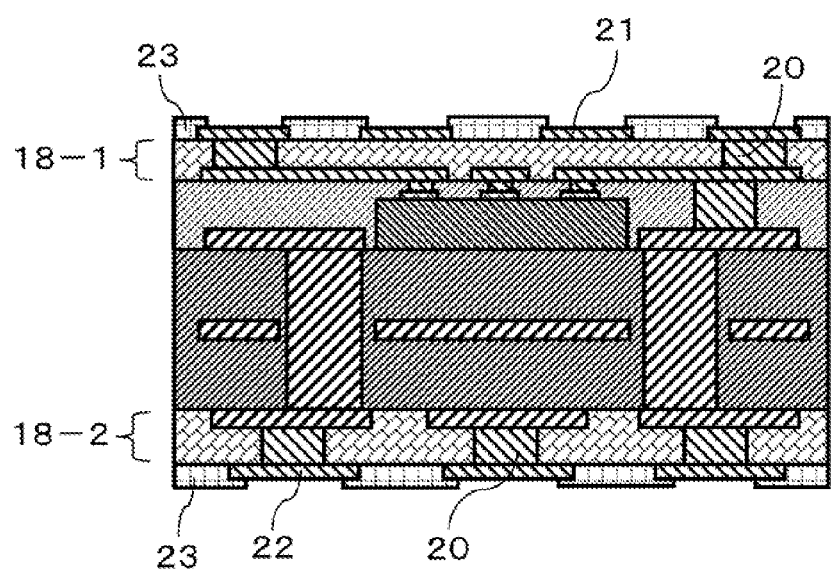
Figure 14A:
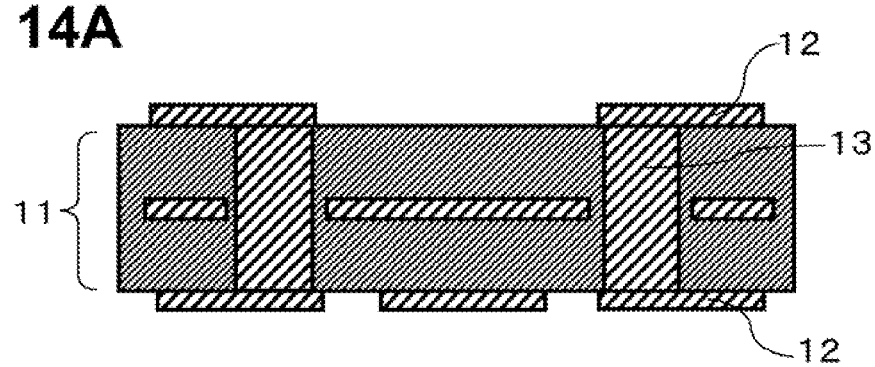
FIGS. 14A to 14C are sectional views of a manufacturing method of a semiconductor device in accordance with a variation of the exemplary embodiment 4 of the present invention.
Figure 14B:
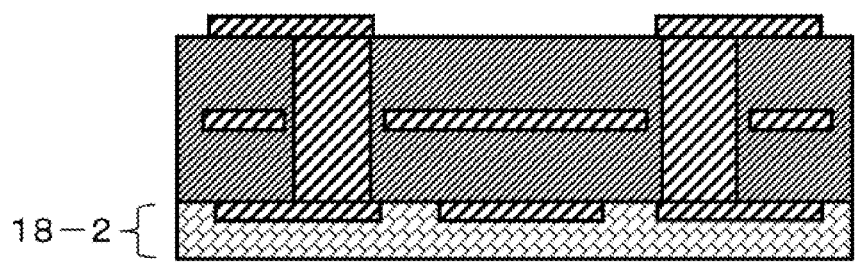
Figure 14C:
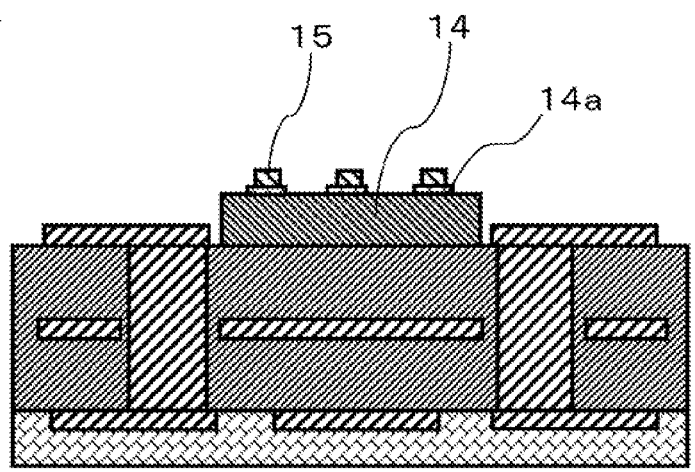
Figure 15A:
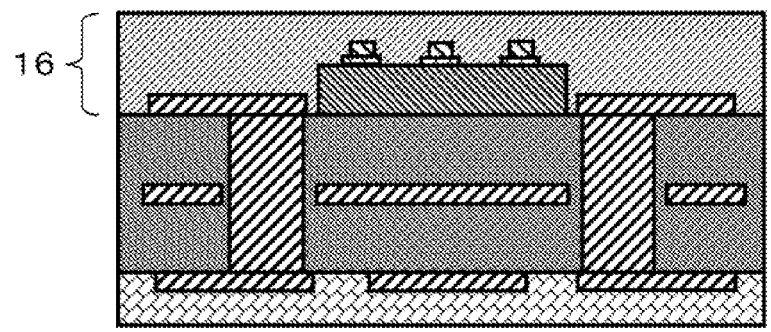
FIGS. 15A to 15C are continuation of the sectional views in accordance with the variation of the exemplary embodiment 4.
Figure 15B:
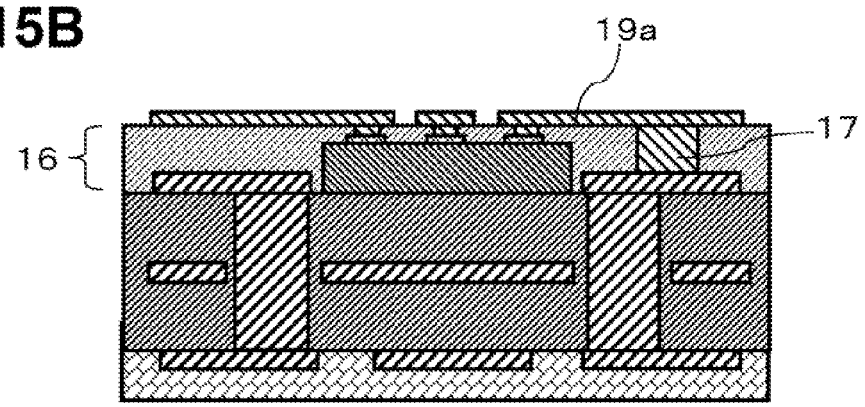
Figure 15C:
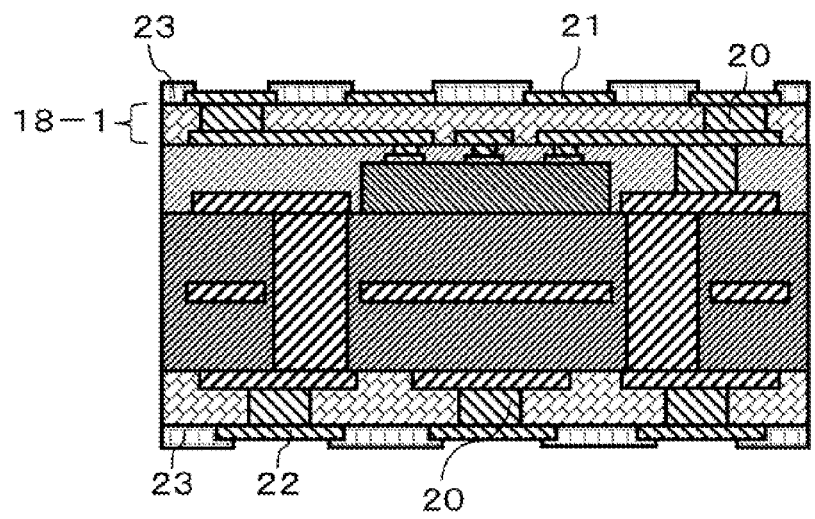

Next, as shown in FIG. 12B, the semiconductor element 14 is mounted on the core substrate 11, on which the positioning mark is arranged, with a surface having electrode terminals 14a of the semiconductor element 14 facing up. In this case, it is preferable that there is a bonding layer between the core substrate 11 and the semiconductor element 14. However, an uncured resin surface of the core substrate 11 may be also used as a bonding layer.

Figure 12C:
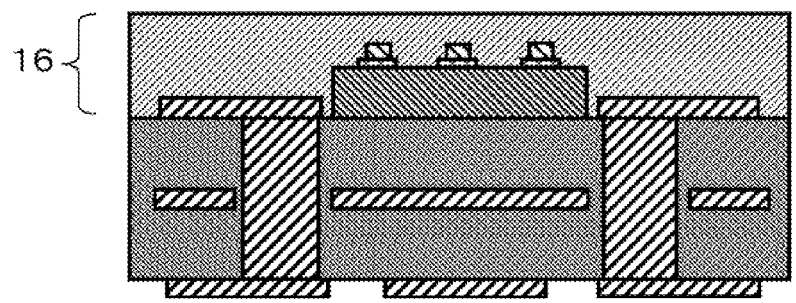

Next, as shown in FIG. 12C, the terminal surface (electrode terminal 14a) and the side surface of the semiconductor element 14 are laminated (covered) with the built-in layer 16. As for a laminating method, a film-type insulating material may be stacked to cover both the terminal surface and the side surface of the semiconductor element 14 at once, or the insulating material may be separately stacked for the terminal surface and the side surface of the semiconductor element 14. And the insulating material is not limited to a film-type insulating resin. A liquid-type insulating resin may be also used.

For example, the insulating layer used for the built-in layer 16, are made of a photosensitive or nonphotosensitive organic material. For example, an epoxy resin, an epoxy acrylate resin, an urethane acrylate resin, a polyester resin, a phenol resin, a polyimide resin, BCB (benzocyclobutene), PBO (polybenzoxazole), a polynorbornene resin, or the like may be used as the organic material. Alternatively, a material obtained by impregnating a woven fabric or nonwoven fabric formed of a glass cloth, an aramid fiber, or the like with an epoxy resin, an epoxy acrylate resin, an urethane acrylate resin, a polyester resin, a phenol resin, a polyimide resin, BCB (benzocyclobutene), PBO (polybenzoxazole), a polynorbornene resin, or the like may be used as the organic material. The resin is laminated by the following methods: a transfer molding method, a compression molding method, a printing method, vacuum pressing, vacuum lamination, a spin coating method, a die coating method, a curtain coating method, or the like. In the present exemplary embodiment, an epoxy resin is adopted as the insulating resin, and stacked on the terminal surface and the side surface of the semiconductor element 14 at once by means of the vacuum lamination.

Next, as shown in FIG. 13A, a connecting portion(s) 15 is formed on the electrode terminal 14a of the semiconductor element 14; a built-in layer via 17 is formed on the core substrate 11; and a wiring(s) 19a connecting the connecting portion 15 and the built-in layer via 17 are formed on the built-in layer 16. First, holes which will become the connecting portions 15 and the built-in layer vias 17 are formed in the built-in layer 16 respectively. The holes are formed by means of photo lithography if the built-in layer 16 is made of a photosensitive material. If the built-in layer 16 is made of a photosensitive material having a high pattern resolution, a fine hole can be fabricated. If the built-in layer 16 is made of a nonphotosensitive material or a photosensitive material having a low pattern resolution, a hole is formed by means of a laser processing method, a dry etching method, or a blasting method. In the present exemplary embodiment, the laser processing method is used. Next, for example, the connecting portion 15 and the built-in layer via 17 are formed by filling up the inside of the holes with at least one metal selected from the group consisting of copper, silver, gold, nickel, aluminum, and palladium or an alloy primarily containing these elements. A filling method such as an electroplating method, an electroless plating method, a printing method or a molten metal suction method is used.

The connecting portion 15 and the built-in layer via 17 may be formed by arranging conducting metal posts in advance on the semiconductor element 14 or the core substrate 11, and removing the surface of the insulating resin by polishing or the like until the surface of each of the metal posts is exposed after forming the built-in layer 16.

The wiring 19a is formed by means of a subtractive method, a semi-additive method, a fully-additive method, or the like. The subtractive method is a method for obtaining a desired pattern by forming a resist of a desired pattern on a copper foil arranged on a board, etching unnecessary part of copper foil, and removing the resist. The semi-additive method is a method for obtaining a desired wiring pattern by forming a feed layer through an electroless plating method, a sputtering method, a CVD (Chemical Vapor Deposition) method, or the like, forming a resist having openings of a desired pattern, depositing a metal in the openings of the resist through an electroplating method, removing the resist, and etching the electric-feed layer. A fully-additive method is a method for obtaining a desired wiring pattern by adsorbing an electroless plating catalyst on a board, forming a resist pattern, activating the catalyst while leaving the resist as an insulating film, and depositing a metal in the openings of the insulating film through an electroless plating method. For example, the wiring 19a is made of at least one metal selected from the group consisting of copper, silver, gold, nickel, aluminum, and palladium or an alloy primarily containing these elements. In particular, it is preferable that the wiring 19a is made of copper, from a viewpoint of the electrical resistance value and cost.

Next, as shown in FIG. 13B, the insulating layer A (18-1), the first electrode 21, and the via 20 are formed on the top surface of the built-in layer 16, and the insulating layer B (18-2), the second electrode 22, and via 20 are formed on the second surface opposite to the built-in layer 16. Here, the number of the insulating layers A (18-1) may be increased as desired. However, in the exemplary embodiment in accordance with this manufacturing method, the insulating layer B (18-2) is set to be a single layer wiring. Meanwhile, in a conductive layer being the same layer as the second electrode 22, a wiring connecting the via 20 and the second electrode 22 may be disposed. As shown in FIGS. 14A-14C, 15A-15C, the insulating layer B (18-2) may be formed before mounting the semiconductor element 14.

According to the present exemplary embodiment, the semiconductor device 10 being a substrate with a built-in semiconductor element can be manufactured effectively. And according to the present exemplary embodiment, since the rigid core substrate 11 is used as a support medium, a semiconductor device 10 having a high yield can be realized. And since a single insulating layer is disposed on a surface opposite to the built-in layer 16, a warp in the semiconductor device 10 can be reduced. Particularly, a step of forming the built-in layer 16 on the first surface of the core substrate 11, on which the semiconductor element is mounted, and the wiring 19a directly connected to the connecting portion 15 being on the built-in layer 16, and a step of forming the insulating layer B (18-2) on the second surface and the wiring layer (the second electrode) 22 including the via 20 are carried out at different steps. Therefore, a step which can perform a fine-fabrication is used for fabricating the connecting portion 15 directly connected to the electrode terminal 14a of the semiconductor 14 and the wiring 19a, and a step which can perform a fabrication at low cost and a high yield can be used for forming the insulating layer, via, and wiring layer on the second surface. For example, the built-in layer 16 may be made of a photosensitive material having a high resolution capable of being fabricated finely, and the connection portion 15 may be formed with high accuracy by means of photo lithography technique. And the insulating layer B (18-2) may be made of a nonphotosensitive material resin, and a hole which will become a via hole may be formed at low cost using a UV-YAG laser or $CO_2$ laser. The wiring 19a is formed to be a fine wiring by means of an additive method, and it also becomes possible to reduce a cost of the whole wiring formation by forming the wiring 19c of the second surface by means of subtractive method.

(Fifth Exemplary Embodiment)

FIGS. 16A-16C, 17 are partial sectional views illustrating, in order of process sequence, a method for manufacturing a semiconductor device in accordance with an exemplary embodiment 5. According to a method for manufacturing a semiconductor device 10 in accordance with the exemplary embodiment 5, the semiconductor device 10 in accordance with the exemplary embodiment 2 as shown in FIG. 2 can be manufactured. A difference of the manufacturing method according to the exemplary embodiment 5 from the manufacturing method according to the exemplary embodiment 4 resides in that the insulating layer of the first surface (the surface on which the semiconductor element 14 is mounted) of the core substrate 11 is constituted by only the built-in layer 16, and the insulating layer A (18-1) is not formed. The different points from the manufacturing method in accordance with the exemplary embodiment 4 will be described below. With respect to points not described in particular, the manufacturing method in accordance with the exemplary embodiment 5 is identical to that in accordance with the exemplary embodiment 4.

Figure 16A:
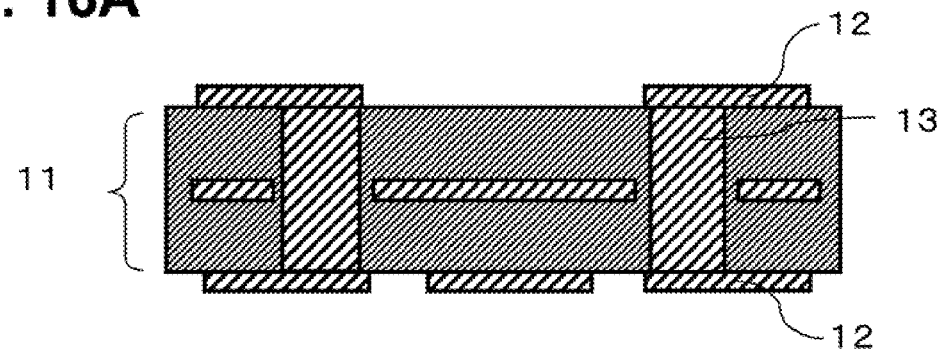
FIGS. 16A to 16C are sectional views of a manufacturing method of a semiconductor device in accordance with an exemplary embodiment 5 of the present invention.
Figure 16B:
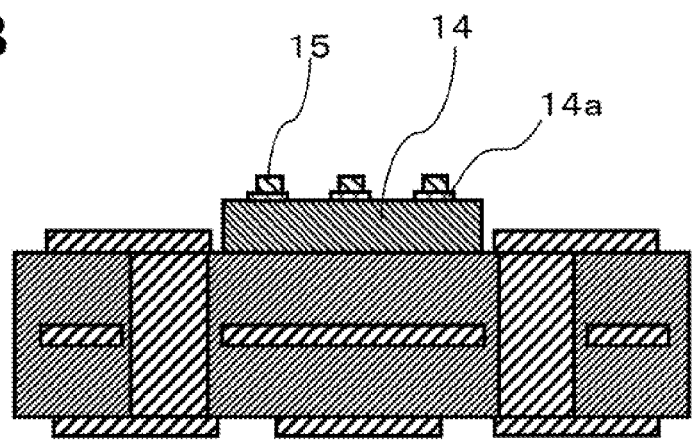
Figure 16C:
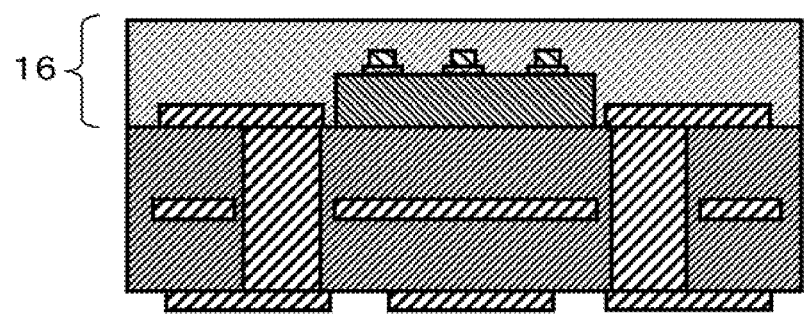
Figure 17:
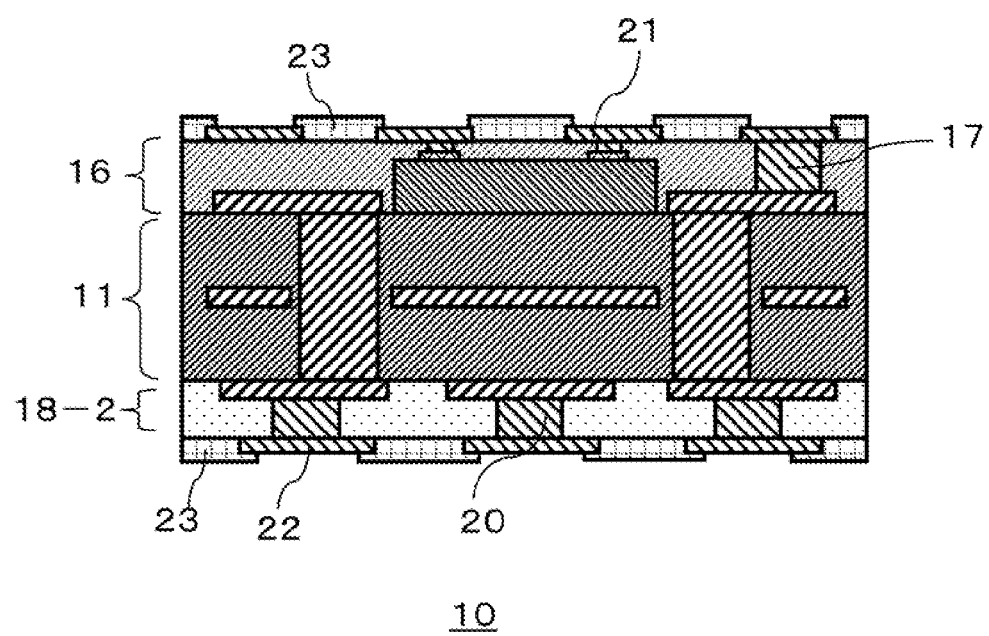
FIG. 17 is a continuation of the sectional view in accordance with the exemplary embodiment 5.

First, as shown in FIG. 16A, a core substrate 11, in which core wirings 12 on the two sides are connected through penetrating vias 13, is provided. Next, as shown in FIG. 16B, a semiconductor element 14 is mounted on the core substrate 11 having a positioning mark with a terminal surface of the semiconductor element 14 facing up. Next, as shown in FIG. 16C, the terminal surface and the side surface of the semiconductor element 14 are laminated (covered) with the built-in layer 16. Next, as shown in FIG. 17, the connecting portion 15 is formed on the electrode terminal 14a of the semiconductor element 14; built-in layer via 17 are formed on the core substrate 11; and the first electrode 21 connecting the connecting portion 15 and the built-in layer via 17 is formed on the built-in layer 16. Next, the insulating layer B (18-2), the second electrode 22, and the via 20 are formed on the surface opposite to the built-in layer 16. Meanwhile, a wiring (corresponding to 19a in FIG. 13A) is disposed on a conductive layer being the same layer as the first electrode 21, and the connecting portion 15 and the first electrode 21 may be connected by this wiring.

According to the present exemplary embodiment, the semiconductor device 10 being a substrate with a built-in semiconductor element can be manufactured effectively. And according to the present exemplary embodiment, since the rigid core substrate 11 is used as a support medium, a semiconductor device having a high yield can be realized. Since the single insulating layer 18-2 is disposed on the surface opposite to the built-in layer 16, a warp in the semiconductor device can be reduced. Furthermore, since one insulating layer and one wiring layer on each of the two sides of the core substrate 11 are disposed, a yield rate and a warp reduction of the semiconductor device can be improved extremely. Furthermore, like the exemplary embodiment 4, a set of the built-in layer 16 on the first surface, the connecting portion 15, and the wiring layer which will become the first electrode 21, and a set of the insulating layer 18-2 on the second surface, via 20, and the wiring layer which will become the second electrode 22 are formed at different steps. Therefore, the connecting portion 15 and the wiring layer 22 of the first surface can be formed with high accuracy by micro-fabricating, and the via 20 and the wiring layer 22 of the second surface can be formed at low cost and a high yield, and so on. By doing so, an optimum process can be selected for each of the steps.

(Sixth Exemplary Embodiment)

FIGS. 18A, 18B are sectional views of main portion of midway process illustrating a method for manufacturing a semiconductor device 10 in accordance with an exemplary embodiment 6. In the present exemplary embodiment, as shown in FIG. 18A, multi-insulating layers and multi-wiring layers are formed on the second surface opposite to the surface of the core substrate 11 on which the semiconductor element is mounted. Further, the second electrodes 22 are formed on the outermost wiring layer in advance. In a stage when wiring patterns of the second surface are completed, an inspection is performed before mounting the semiconductor element 14 to confirm that there are no defects on the core substrate 11 and patterns of the second surface. Next, as shown in FIG. 18B, the semiconductor element 14 is mounted on the support substrate which is confirmed that there are no defects on the wiring patterns of the second surface. After that, the semiconductor device 10 as shown in FIG. 9 is completed by carrying out only the process of fabricating the first surface among the steps of the exemplary embodiments 4 and 5.

According to this exemplary embodiment, a process of forming a set of the built-in layer 16, the connecting portion 15, and the wiring 19a of the first surface, and a step of forming a set of the insulating layer 18-2, the via 20, and the wirings 19c, 19d of the second surface are carried out at different steps. Therefore, the connecting portion 15 and the wiring layer 21 of the first surface can be fine-fabricated, and the via 20 and the wiring layer 22 of the second surface can be manufactured at low cost and a high yield.

Furthermore, according to the exemplary embodiment 6, after forming and inspecting the wiring patterns of the second surface, the semiconductor element 14 is mounted on the core substrate 11. Therefore, a step of mounting the semiconductor element 14 on the core substrate 11 can be carried out as late as possible. Hence, particularly, a yield after mounting the semiconductor element 14 on the core substrate can be improved. So, a probability, in which the semiconductor device 10 including the semiconductor element 14 must be being wasted due to defects of other than the semiconductor device 14, can be reduced.

In the present invention, the possible or preferable modes will be described as follows.

(Mode 1)

As described in the above-mentioned first aspect.

(Mode 2)

It is preferable that a shape of each of the via disposed at the second surface is larger than a shape of the connecting portion.

(Mode 3)

It is preferable that a top diameter, a bottom diameter, and a height of each of the via disposed at the second surface are larger than a top diameter, a bottom diameter, and a height of the connecting portion respectively.

(Mode 4)

It is preferable that a volume of each of the via disposed at the second surface is three times or more of that of the connecting portion.

(Mode 5)

It is preferable that a thickness of the wiring layer which is directly connected to the connecting portion is thinner than that of any of the wiring layer disposed at the second surface.

(Mode 6)

It is preferable that a thickness, a minimum wiring width, and a minimum wiring interval of each of the wiring layer disposed at the second surface are one and a half times or more of a thickness, a minimum wiring width, and a minimum wiring interval of the wiring layer directly connected to the connecting portion, respectively.

(Mode 7)

It is preferable that a material of the insulating layer around the connecting portion(s) is different from a material of the insulating layer not including the connecting portion(s).

(Mode 8)

It is preferable that the insulating layer around the connecting portion is made of a photosensitive resin, and the insulating layer disposed on the second surface is made of a non-photosensitive resin.

(Mode 9)

It is preferable that a coefficient of elasticity of the insulating layer around the connecting portion(s) is lower than that of the insulating layer not including the connecting portion(s).

(Mode 10)

It is preferable that the connecting portion does not include a solder material and a resin component.

(Mode 11)

It is preferable that the insulating layer and the wiring layer of the second surface are a single layer respectively.

(Mode 12)

It is preferable that the insulating layer and the wiring layer of the first surface are a single layer respectively.

(Mode 13)

It is preferable that an external electrode is disposed on each of outermost wiring layers of the first surface and the second surface.

(Mode14)

It is preferable that a minimum pitch of the connecting portions is narrower than that of the external electrodes.

(Mode 15)

It is preferable that the semiconductor device further comprises an electronic component connected to the external electrode.

(Mode 16)

It is preferable that a recessed portion is formed at the first surface of the core substrate, and the semiconductor element is mounted on the recessed portion.

(Mode 17)

It is preferable that a plurality of semiconductor elements are mounted on the first surface of the core substrate with a surface for forming element facing up.

(Mode 18)

It is preferable that a reinforcement material is disposed in at least one the insulating layer among a plurality of insulating layers.

(Mode 19)

As described in the above-mentioned second aspect.

(Mode 20)

It is preferable that a wiring is formed by means of additive method in the first wiring forming step, and a wiring is formed by means of subtractive method in the second wiring forming step.

(Mode 21)

It is preferable that the process of mounting the semiconductor element is carried out after forming the second insulating layer.

(Mode 22)

It is preferable that the step of mounting the semiconductor element is carried out after the second wiring forming step.

(Mode 23)

It is preferable that after the second wiring forming step, an insulating layer and a wiring layer are further formed to be stacked on a surface of the second wiring layer of the second surface; after a multilayer wiring formation of the second surface is completed, the step of mounting the semiconductor element is carried out.

(Mode 24)

It is preferable that after forming the first insulating layer, a via hole from a surface of the first insulating layer to the electrode terminal of the semiconductor element and a via hole from the surface of the first insulating layer to the core wiring disposed on the first surface are formed, and the connecting portion and the via are formed by filling up the via holes with conductive layers.

(Mode 25)

It is preferable that the method for manufacturing the semiconductor device comprises: forming a first insulating layer made of a photosensitive resin; forming a via hole leading to the electrode terminal of the semiconductor element by means of photolithography; forming a second insulating layer made of a nonphotosensitive resin; and forming a via in the second insulating layer using a laser.

(Mode 26)

It is preferable that the semiconductor element has a metal post disposed on a surface of the electrode terminal, and the first wiring forming process comprises removing part of the first insulating layer so that a surface of the metal post is exposed, and forming the connecting portion by the metal post.

(Mode 27)

It is preferable that the process of forming the first insulating layer with which the semiconductor element is covered comprises: covering an outer peripheral portion of the semiconductor element with a first insulating resin; and covering a surface of the semiconductor element with a second insulating resin.

So far, the exemplary embodiments have been explained. However, the present invention of course is not limited to the only constitution of the above-mentioned exemplary embodiments, and includes various variations and modifications that could be made by those skilled in the art within the present invention. That is, the exemplary embodiments and examples may include variations and modifications without departing the gist and scope of the present invention as disclosed herein and claimed as appended herewith, and furthermore based on the fundamental technical concept. It should be noted that any combination and/or selection of the disclosed elements may fall within the claims of the present invention. That is, it should be noted that the present invention of course includes various variations and modifications that could be made by those skilled in the art according to the overall disclosures including claims and technical concept.

Explanations of Symbols 10, 100 semiconductor device
11 core substrate
12 core wiring(s)
13 penetrating via(s)
14 semiconductor element
14a electrode terminal
15 connecting portion(s) (metal post)
16 built-in layer (insulating layer)
17 built-in layer via(s)
18-1 insulating layer A
18-2 insulating layer B
19 wiring layer, and wiring formed in the wiring layer
19a wiring layer in which wiring(s) directly connected to connecting portion(s) 15 is formed, and wiring(s) formed in the wiring layer
19b wiring layer (wiring) other than wiring layer 19a among wiring layers disposed on the first surface side of core substrate 11, and wiring formed in the wiring layer
19c lower wiring layer on the second surface side of core substrate 11, and wiring(s) formed in the wiring layer
19d upper wiring layer on the second surface side of core substrate 11, and wiring(s) formed in the wiring layer
20 via(s)
21 first electrode(s) (wiring layer)
22 second electrode(s) (wiring layer)
23 solder resist
24 electronic component
25 bonding material
26 reinforcement material

What is claimed is:

1. A semiconductor device comprising:
a core substrate;
at least one insulating layer and at least one wiring layer which are disposed on each of a first surface of said core substrate and a second surface opposite to said first surface;
a via(s) which is disposed in each of said insulating layer and said core substrate, and connects said wiring layers to each other;
a semiconductor element, mounted on said first surface of said core substrate, with a surface for forming an electrode terminal(s) facing up; and
a connecting portion(s) which penetrates the insulating layer disposed on said first surface and directly connects the electrode terminal of said semiconductor element and the wiring layer disposed on said first surface,
wherein a minimum wiring pitch of the wiring layer directly connected to said connecting portion is smaller than that of any of the wiring layer(s) disposed on said second surface.

2. The semiconductor device according to claim 1, wherein a shape of each of the via(s) disposed on said second surface is larger than a shape of said connecting portion.

3. The semiconductor device according to claim 1, wherein a top diameter, a bottom diameter, and a height of each of the via(s) disposed on said second surface are larger than a top diameter, a bottom diameter, and a height of said connecting portion, respectively.

4. The semiconductor device according to claim 1, wherein a volume of each of the via(s) disposed on said second surface is three times or more of that of said connecting portion.

5. The semiconductor device according to claim 1, wherein a thickness of the wiring layer directly connected to said connecting portion is thinner than that of any of the wiring layer(s) disposed on said second surface.

6. The semiconductor device according to claim 1, wherein a thickness, a minimum wiring width, and a minimum wiring interval (distance) of each of the wiring layer(s) disposed on said second surface are one and a half times or more of a thickness, a minimum wiring width, and a minimum wiring interval of the wiring layer(s) directly connected to said connecting portion, respectively.

7. The semiconductor device according to claim 1, wherein a material of the insulating layer around said connecting portion is different from a material of the insulating layer not including said connecting portion.

8. The semiconductor device according to claim 1, wherein the insulating layer around said connecting portion is made of a photosensitive resin, and the insulating layer disposed on said second surface is made of a nonphotosensitive resin.

9. The semiconductor device according to claim 1, wherein a coefficient of elasticity of the insulating layer around said connecting portion is lower than that of the insulating layer not including said connecting portion.

10. The semiconductor device according to claim 1, wherein said connecting portion does not include a solder material and a resin component.

11. The semiconductor device according to claim 1, wherein the insulating layer and the wiring layer of said second surface are a single layer, respectively.

12. The semiconductor device according to claim 1, wherein the insulating layer and the wiring layer of said first surface are a single layer, respectively.

13. The semiconductor device according to claim 1, wherein an external electrode(s) is disposed on each outermost wiring layer of said first surface and said second surface.

14. The semiconductor device according to claim 13, wherein a minimum pitch of said connecting portion is narrower than that of said external electrodes.

15. The semiconductor device according to claim 13, further comprising an electronic component connected to said external electrode.

16. The semiconductor device according to claim 1, wherein a recessed portion is provided on said first surface of said core substrate, and said semiconductor element is mounted in said recessed portion.

17. The semiconductor device according to claim 1, wherein a plurality of semiconductor elements are mounted on said first surface of said core substrate with a surface for forming element facing up.

18. The semiconductor device according to claim 1, wherein a reinforcement material is disposed in at least one insulating layer among said a plurality of insulating layers.

* * * * *